(12) United States Patent
Nitta et al.

(10) Patent No.: US 11,875,990 B2
(45) Date of Patent: Jan. 16, 2024

(54) SEMICONDUCTOR DEVICE INCLUDING IGBT, BOUNDARY, AND DIODE REGIONS

(71) Applicant: Mitsubishi Electric Corporation, Tokyo (JP)

(72) Inventors: Tetsuya Nitta, Tokyo (JP); Munenori Ikeda, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/240,371

(22) Filed: Apr. 26, 2021

(65) Prior Publication Data
US 2022/0013634 A1    Jan. 13, 2022

(30) Foreign Application Priority Data
Jul. 10, 2020  (JP) ................................ 2020-118986

(51) Int. Cl.
*H01L 29/08* (2006.01)
*H01L 27/06* (2006.01)
(Continued)

(52) U.S. Cl.
CPC ...... *H01L 29/0834* (2013.01); *H01L 21/2253* (2013.01); *H01L 21/266* (2013.01);
(Continued)

(58) Field of Classification Search
CPC ............. H01L 29/7803; H01L 29/7804; H01L 29/7805; H01L 29/7808; H01L 29/7395; H01L 29/7396; H01L 29/7397
See application file for complete search history.

(56) References Cited

U.S. PATENT DOCUMENTS

2008/0048295 A1*  2/2008  Takahashi ........... H01L 29/7397
                                                                     257/E21.384
2009/0072339 A1    3/2009  Tsuzuki et al.
(Continued)

FOREIGN PATENT DOCUMENTS

JP    2008-053648 A    3/2008
JP    2009-071217 A    4/2009
(Continued)

OTHER PUBLICATIONS

An Office Action; "Notice of Reasons for Refusal," mailed by the Japanese Patent Office dated Aug. 1, 2023, which corresponds to Japanese Patent Application No. 2020-118986 and is related to U.S. Appl. No. 17/240,371; with English language translation.

*Primary Examiner* — Jesse Y Miyoshi
(74) *Attorney, Agent, or Firm* — Studebaker & Brackett PC

(57) ABSTRACT

Provided is a semiconductor device in which a first anode layer and a first contact layer are provided on a first main surface side in a diode region, and in which a second anode layer and a second contact layer are provided on the first main surface side in a boundary region. A concentration of impurities of a second conductive type of the second anode layer is lower than a concentration of impurities of the second conductive type of the first anode layer, or an occupied area ratio of the second contact layer with respect to the area where the emitter electrode is in contact with the semiconductor substrate in the boundary region is smaller than an occupied area ratio of the first contact layer with respect to the area where the emitter electrode is in contact with the semiconductor substrate in the diode region.

6 Claims, 27 Drawing Sheets

(51) Int. Cl.

| | |
|---|---|
| *H01L 29/739* | (2006.01) |
| *H01L 29/861* | (2006.01) |
| *H01L 29/66* | (2006.01) |
| *H01L 21/265* | (2006.01) |
| *H01L 21/266* | (2006.01) |
| *H01L 21/225* | (2006.01) |
| *H01L 29/78* | (2006.01) |

(52) U.S. Cl.
CPC .... *H01L 21/26513* (2013.01); *H01L 27/0664* (2013.01); *H01L 29/66136* (2013.01); *H01L 29/66348* (2013.01); *H01L 29/7397* (2013.01); *H01L 29/7805* (2013.01); *H01L 29/8613* (2013.01)

(56) References Cited

U.S. PATENT DOCUMENTS

| | | | |
|---|---|---|---|
| 2012/0132954 A1 | 5/2012 | Kouno et al. | |
| 2014/0084337 A1* | 3/2014 | Matsudai | H01L 29/0696 257/140 |
| 2015/0295042 A1* | 10/2015 | Kameyama | H01L 27/0629 257/140 |
| 2019/0252533 A1 | 8/2019 | Naito | |
| 2019/0252534 A1* | 8/2019 | Murakawa | H01L 29/0834 |
| 2019/0259747 A1* | 8/2019 | Gejo | H01L 29/0623 |

FOREIGN PATENT DOCUMENTS

| | | |
|---|---|---|
| JP | 2012-129504 A | 7/2012 |
| JP | 2018-73911 A | 5/2018 |
| WO | 2018/220879 A1 | 12/2018 |

\* cited by examiner

F I G. 5
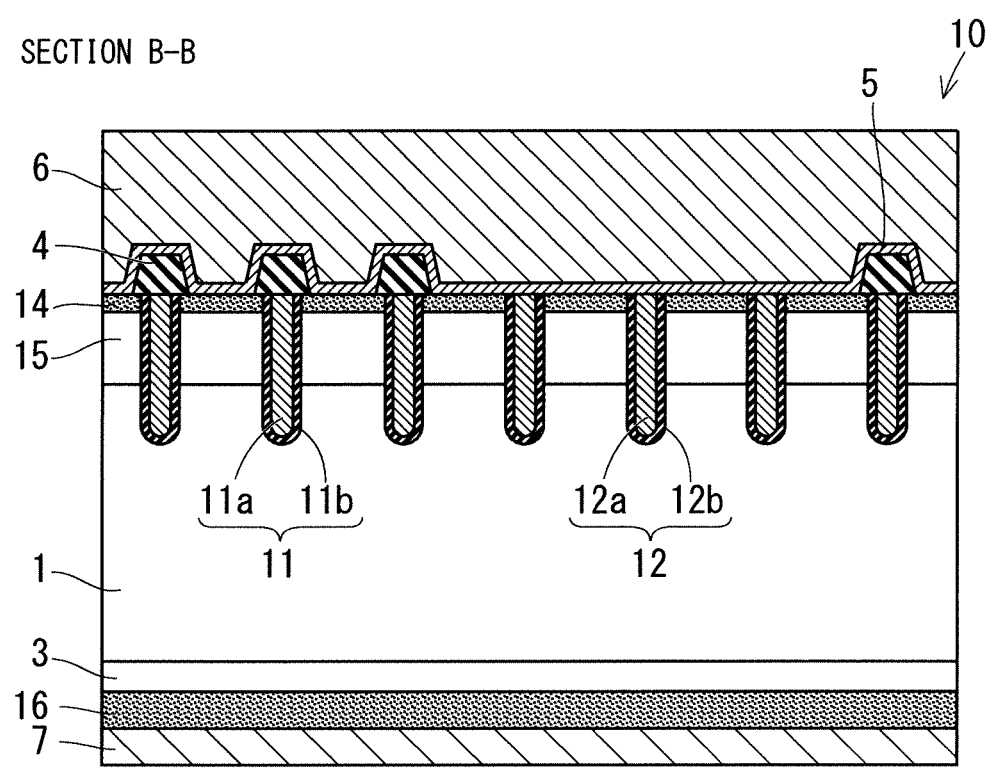

F I G. 1 1
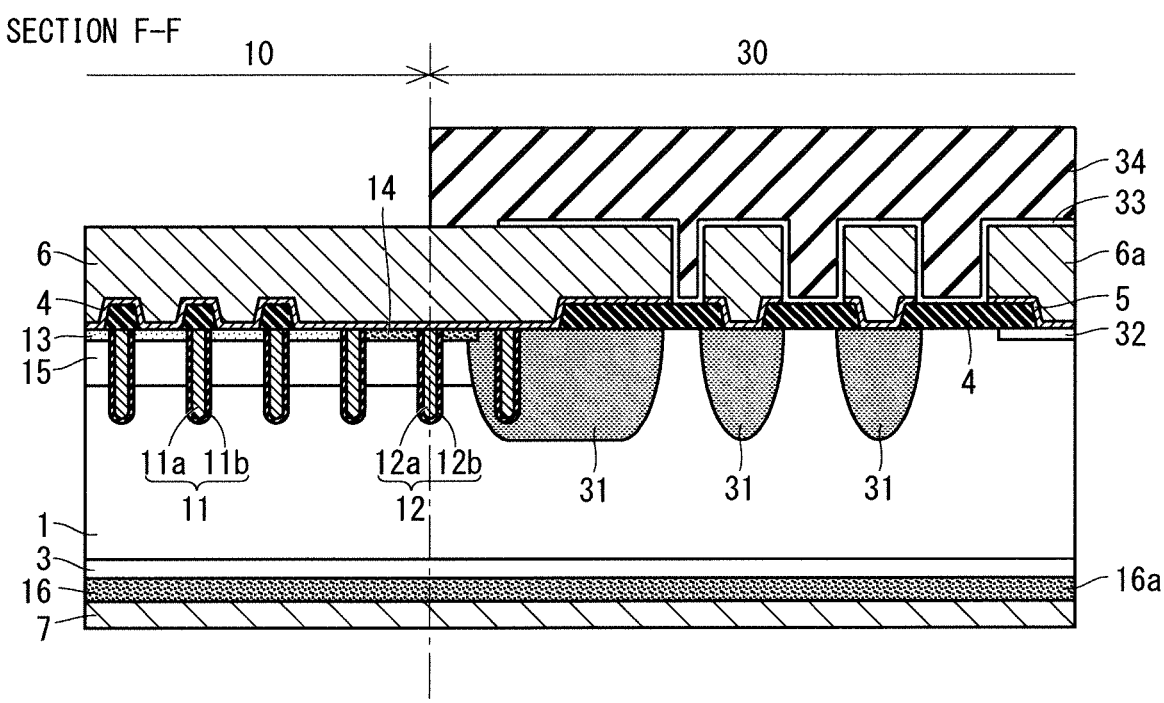

F I G. 2 3
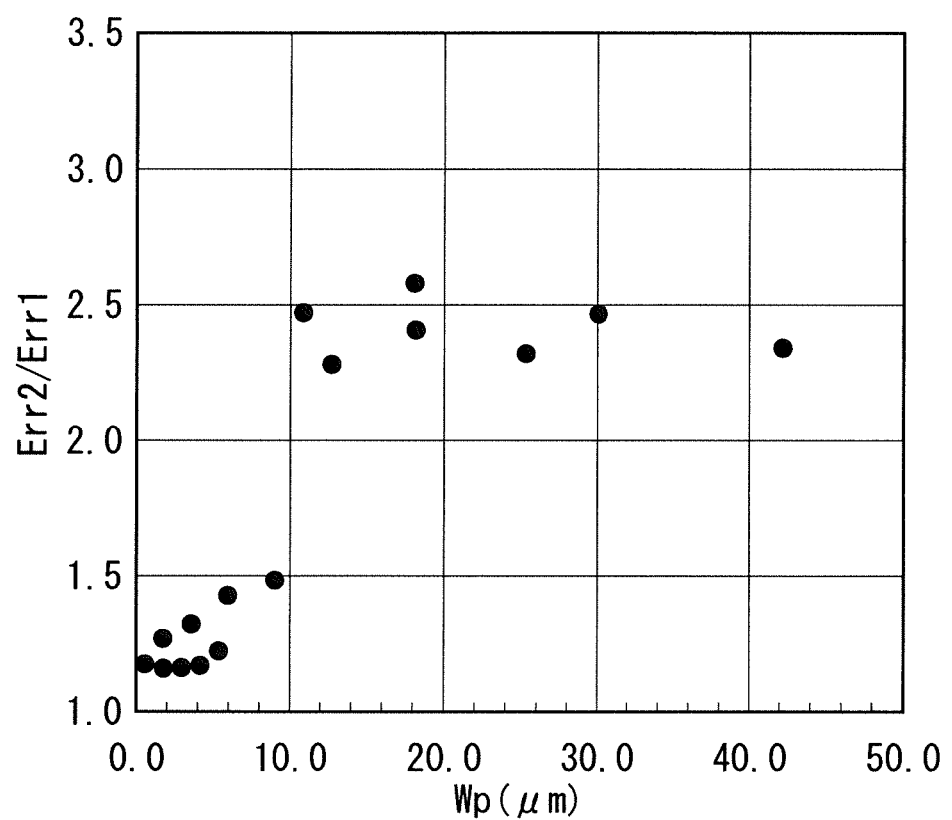

F I G. 2 4
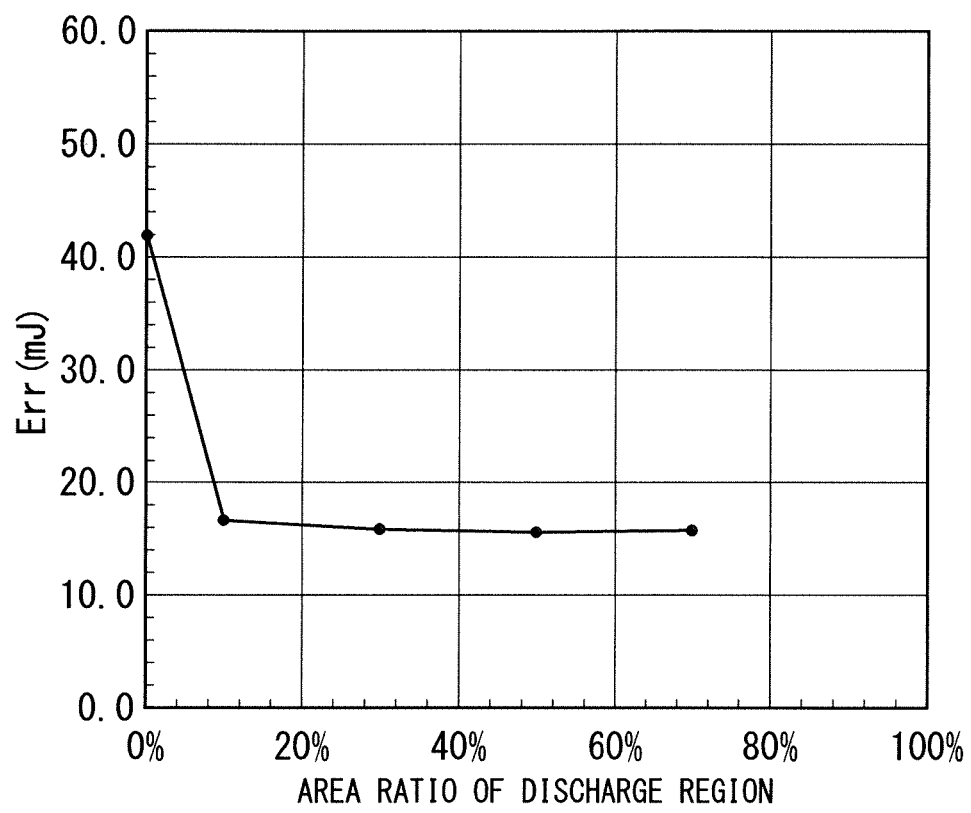

SEMICONDUCTOR DEVICE INCLUDING IGBT, BOUNDARY, AND DIODE REGIONS

BACKGROUND OF THE INVENTION

Field of the Invention

The present disclosure relates to a semiconductor device.

Description of the Background Art

Power semiconductor devices such as power devices, which are a type of semiconductor device, are used in a wide range of fields such as home appliances, automobiles, and railways. In these fields, an inverter circuit composed of a power device often drives an inductive load such as an induction motor. Inverter devices for these applications are configured by using power semiconductor devices such as insulated gate bipolar transistors (IGBTs) or metal-oxide-semiconductor field-effect transistors (MOSFETs), and free-wheeling diodes (hereinafter simply referred to as "diodes").

The inverter devices are each required to have high efficiency and low power consumption, so that the market demands a power semiconductor device to be mounted, having high performance at low cost. To meet these demands, reverse conducting IGBTs (RC-IGBTs) have been developed. The RC-IGBTs are formed by integrating an IGBT and a diode into the same semiconductor substrate, and thus can acquire reduction in area of mounted elements, reduction in the number of mounted elements, reduction in mounting area of elements, and reduction in thermal resistance (e.g., Japanese Patent Application Laid-Open No. 2008-53648).

The RC-IGBTs each includes the IGBT and the diode that are provided in an IGBT region and a diode region, respectively. In the diode region, a recovery operation occurs when the diode shifts from an on-state to an off-state. When the diode changes from the on-state to the off-state, electron carriers and hole carriers accumulated in the RC-IGBT during the on-state are discharged, so that a recovery operation is performed in which a reverse current flows from a cathode side to an anode side. The reverse current flowing during recovery operation is called a recovery current, and power loss occurring in accordance with a current value of the recovery current, an applied voltage value, and time in which the current flows, is called recovery loss.

In general, to achieve a low recovery loss, the recovery current needs to be reduced by reducing carriers accumulated in the diode in the on-state. As such a configuration, it is conceivable to provide a p-type hole discharge region in a part of a back surface in the diode region to promote discharge of hole carriers from the back surface during forward operation to reduce carrier accumulation. Unfortunately, even when the p-type hole discharge region is provided, there is a problem that the recovery loss cannot be effectively reduced when there is a large amount of hole inflow from the IGBT region adjacent to the diode region to the diode region.

SUMMARY

The present disclosure is made in view of the above problems, and an object of the present disclosure is to provide a technique capable of effectively reducing recovery loss.

A semiconductor device according to the present disclosure includes: a semiconductor substrate of a first conductive type, having a first main surface and a second main surface opposite to the first main surface, an IGBT region, a diode region, and a boundary region between the IGBT region and the diode region, being provided along an in-plane direction in the semiconductor; an emitter electrode provided on the first main surface of the semiconductor substrate; and a collector electrode provided on the second main surface of the semiconductor substrate. The semiconductor substrate includes: a first anode layer of a second conductive type and a first contact layer of the second conductive type with a higher concentration of impurities of the second conductive type than the first anode layer, being provided on a first main surface side being a side of the first main surface, in the diode region; a cathode layer of the first conductive type provided on a second main surface side being a side of the second main surface, in the diode region; a first carrier discharge layer of the second conductive type provided adjacent to the cathode layer in the in-plane direction on the second main surface side in the diode region; a second anode layer of the second conductive type and a second contact layer of the second conductive type with a higher concentration of impurities of the second conductive type than the second anode layer, being provided on the first main surface side in the boundary region; and a collector layer of the second conductive type provided on the second main surface side in the boundary region. A concentration of impurities of the second conductive type of the second anode layer is lower than a concentration of impurities of the second conductive type of the first anode layer, or an occupied area ratio of the second contact layer with respect to the area where the emitter electrode is in contact with the semiconductor substrate in the boundary region is smaller than an occupied area ratio of the first contact layer with respect to the area where the emitter electrode is in contact with the semiconductor substrate in the diode region.

This enables recovery loss to be effectively reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 4 and 5 are each a sectional view illustrating a structure of the IGBT region of the semiconductor device according to the first preferred embodiment;

FIGS. 11 and 12 are each a sectional view illustrating a structure of a terminal region of the semiconductor device according to the first preferred embodiment;

FIG. 23 is a diagram illustrating a simulation result of the semiconductor device according to the third preferred embodiment;

FIG. 24 is a diagram illustrating a simulation result of a semiconductor device according to a fourth preferred embodiment;

DESCRIPTION OF THE PREFERRED EMBODIMENTS

Figure 1:
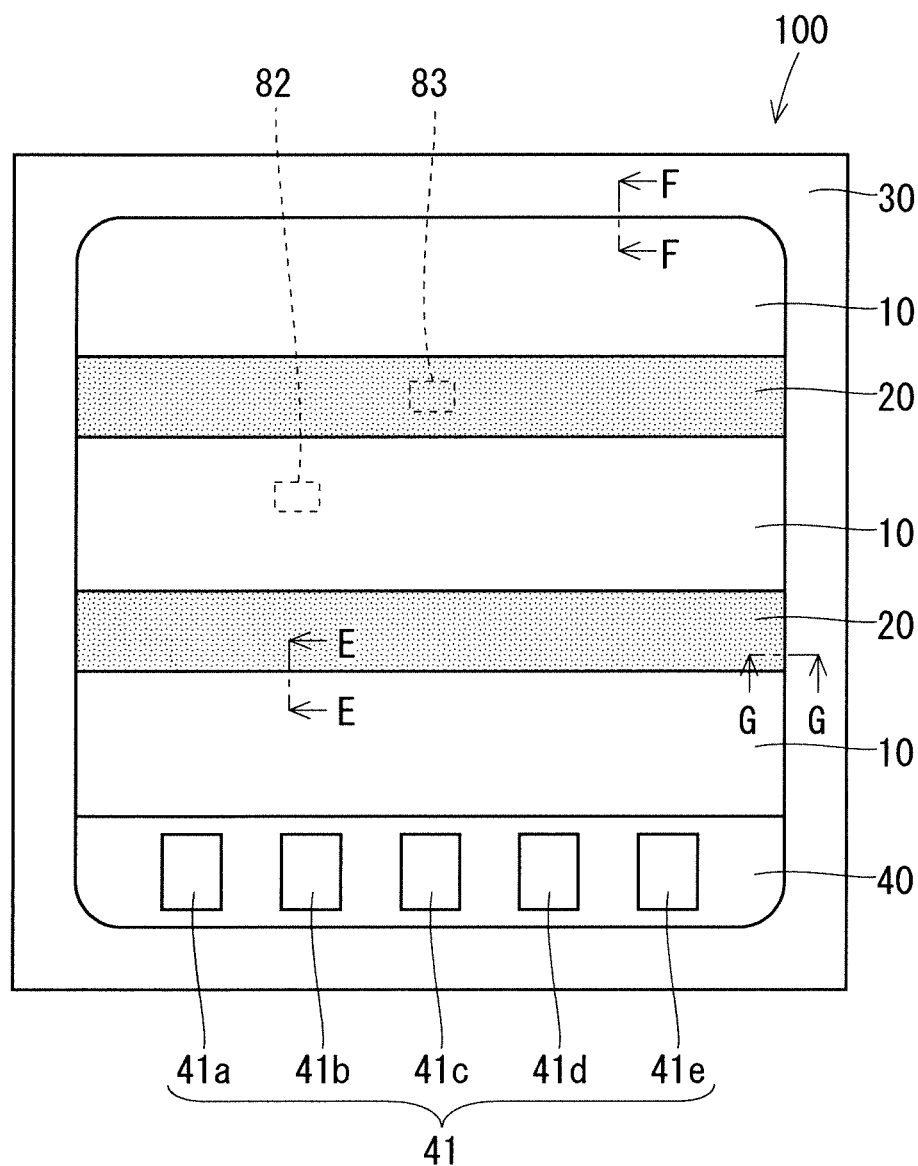
FIG. 1 is a plan view illustrating a structure of a semiconductor device according to a first preferred embodiment.

Hereinafter, preferred embodiments will be described with reference to the accompanying drawings. Features described in each of the following preferred embodiments are exemplary and all the features are not necessarily required. In the description shown below, similar components are designated by identical or similar reference numerals in the plurality of preferred embodiments, and different components will be mainly described. The description described below shows specific positions and directions such as "up", "down", "left", "right", "front", and "back" that are not necessarily identical to directions at the time of actual implementation. One part having a higher concentration than another part means that, for example, an average concentration of the one part is higher than an average concentration of the other part, or a maximum value of the concentration of the one part is higher than a maximum value of the concentration of the other part.

The following description shows n and p that each indicate a conductive type of a semiconductor. Although the present disclosure is described in which a first conductive type is designated as an n-type and a second conductive type is designated as a p-type, the first conductive type may be designated as the p-type, and the second conductive type may be designated as the n-type. An impurity concentration lower than n is indicated as if, and an impurity concentration higher than n is indicated as n$^+$. Similarly, an impurity concentration lower than p is indicated as p$^-$, and an impurity concentration higher than p is indicated as p$^+$.

First Preferred Embodiment

Figure 2:
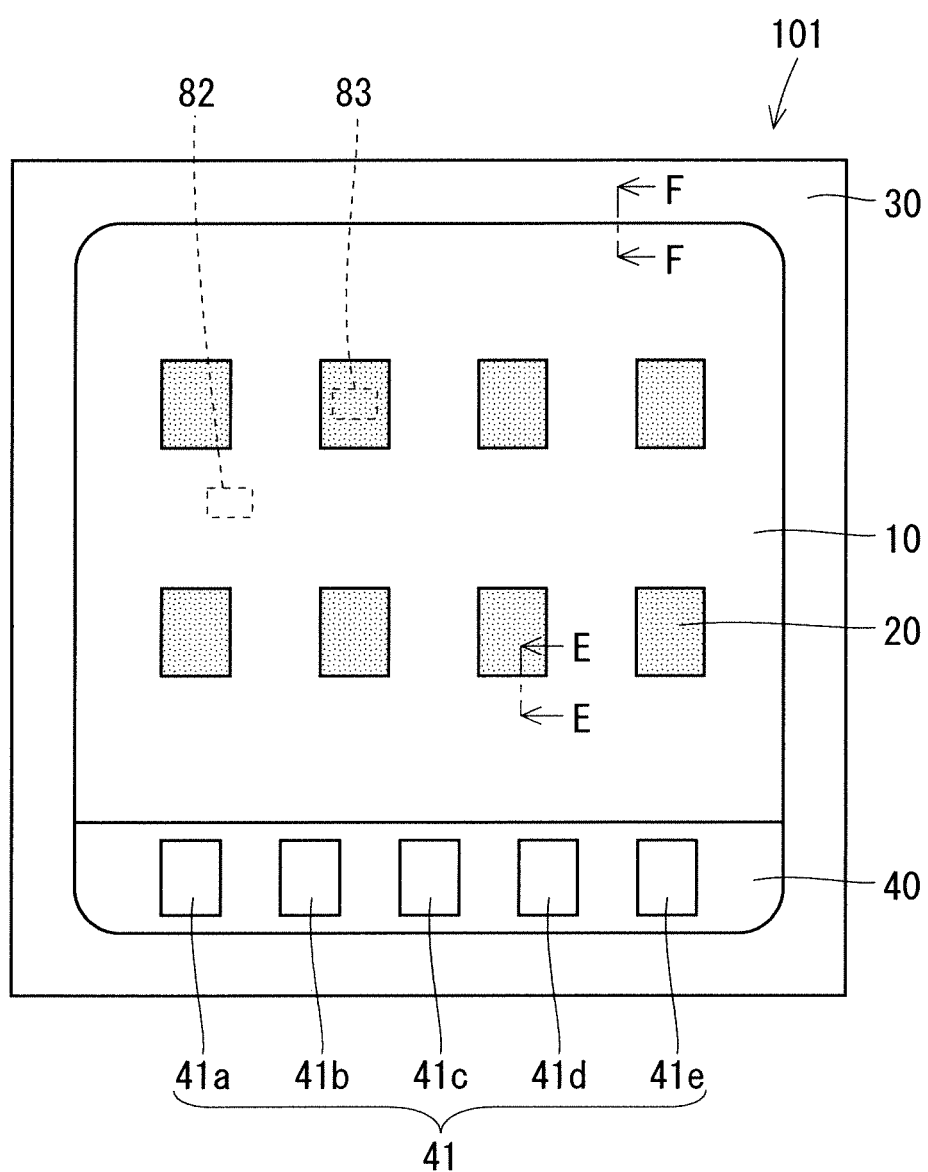
FIG. 2 is a plan view illustrating another structure of the semiconductor device according to the first preferred embodiment.

FIG. 1 is a plan view illustrating a structure of a semiconductor device that is an RC-IGBT according to a first preferred embodiment. FIG. 2 is a plan view illustrating another structure of the semiconductor device that is the RC-IGBT according to the first preferred embodiment. FIG. 1 illustrates a semiconductor device 100 that includes an IGBT region 10 and a diode region 20, being provided side by side in a stripe shape, and that may be simply referred to as a "strip type" in the following description. FIG. 2 illustrates a semiconductor device 101 that includes multiple diode regions 20 provided in a vertical direction and a horizontal direction, and an IGBT region 10 provided around the diode regions 20, and that may be simply referred to as an "island type" in the following description.

<Entire Plane Structure of Stripe Type>

In FIG. 1, the semiconductor device 100 includes the IGBT region 10 and the diode region 20 in one semiconductor device. Each of the IGBT region 10 and the diode region 20 extends from one end side to the other end side of the semiconductor device 100, and is provided alternately in a stripe shape in a direction orthogonal to an extending direction of each of the IGBT region 10 and the diode region 20. FIG. 1 illustrates three IGBT regions 10 and two diode regions 20, and a structure in which all the diode regions 20 are interposed between the corresponding IGBT regions 10. However, the number of the IGBT regions 10 and the diode regions 20 is not limited to this, the number of the IGBT regions 10 may be three or more, or three or less, and the number of the diode regions 20 may be two or more, or two or less. Locations of the IGBT regions 10 and the diode regions 20 in FIG. 1 may be exchanged, and all the IGBT regions 10 may be interposed between the corresponding diode regions 20. Additionally, the IGBT regions 10 and the diode regions 20 may be provided adjacent to each other one by one.

As illustrated in FIG. 1, a pad region 40 is provided adjacent to the IGBT region 10 on a lower side in the drawing. The pad region 40 is provided with a control pad 41 for controlling the semiconductor device 100. In the following description, the IGBT region 10 and the diode region 20 may be collectively referred to as a cell region. A terminal region 30 is provided around a region including the cell region and the pad region 40 to hold withstand voltage of the semiconductor device 100. The terminal region 30 may be appropriately provided with a well-known withstand voltage holding structure. The withstand voltage holding structure may be configured such that, for example, a field limiting ring (FLR) in which a cell region is surrounded by a p-type terminal well layer of a p-type semiconductor, or with a variation of lateral doping (VLD) in which a cell region is surrounded by a p-type well layer with a concentration gradient is provided on the first main surface side, i.e., front surface side of the semiconductor device 100. The number of p-type terminal well layers in the shape of a ring used for the FLR and concentration distribution used for the VLD may be appropriately selected depending on withstand voltage design of the semiconductor device 100. The p-type terminal well layer may be provided over almost the entire pad region 40, and the pad region 40 may be provided with an IGBT cell or a diode cell.

The control pad 41 includes, for example, at least any one of a current sense pad 41a, a Kelvin emitter pad 41b, a gate pad 41c, and temperature sense diode pads 41d, 41e.

The current sense pad 41a is a control pad for detecting a current flowing through the cell region of the semiconductor device 100. The current sense pad 41a is electrically connected to the cell to allow a current to flow through the cell region of the semiconductor device 100 such that a current of a fraction to a fraction of tens of thousandths flowing through the entire cell region flows through a part of the IGBT cell or the diode cell in the cell region.

The Kelvin emitter pad 41b and the gate pad 41c are each a control pad to which gate drive voltage for on-off control of the semiconductor device 100 is applied. The Kelvin emitter pad 41b is electrically connected to a p-type base layer of the IGBT cell. The gate pad 41c is electrically connected to a gate trench electrode of the IGBT cell. The Kelvin emitter pad 41b and the p-type base layer may be electrically connected with a $p^+$ type contact layer interposed therebetween. The temperature sense diode pads 41d, 41e are control pads electrically connected to an anode and a cathode of the temperature sense diode provided in the semiconductor device 100. Voltage between the anode and cathode of the temperature sense diode (not illustrated) provided in the cell region is measured through the temperature sense diode pads 41d, 41e, and temperature of the semiconductor device 100 is measured based on the voltage.

<Entire Plane Structure of Island Type>

In FIG. 2, the semiconductor device 101 includes the IGBT region 10 and the diode region 20 in one semiconductor device. Multiple diode regions 20 are disposed side by side in each of the vertical direction and the horizontal direction in the semiconductor device 101, and the periphery of each of the diode regions 20 is surrounded by the IGBT region 10. That is, the multiple diode regions 20 are provided in an island shape in the IGBT region 10. FIG. 2 illustrates a structure in which the diode region 20 is provided in a matrix with four columns in a left-right direction in the drawing and two rows in the vertical direction in the drawing. However, the number and placement of the diode regions 20 are not limited to this. One or more diode regions 20 may be provided scattered in the IGBT region 10 as long as the periphery of each of the diode regions 20 is surrounded by the IGBT region 10.

As illustrated in FIG. 2, the pad region 40 is provided adjacent to a lower side of the IGBT region 10 in the drawing. The pad region 40 is a region in which the control pad 41 for controlling the semiconductor device 101 is provided. Even in the description here, the IGBT region 10 and the diode region 20 are collectively referred to as a cell region. The terminal region 30 is provided around a region including the cell region and the pad region 40 to hold withstand voltage of the semiconductor device 101. The terminal region 30 may be appropriately provided with a well-known withstand voltage holding structure. The withstand voltage holding structure may be configured such that, for example, a FLR in which a region including the cell region and the pad region 40 is surrounded by a p-type terminal well layer of a p-type semiconductor, or with a VLD in which the cell region is surrounded by a p-type well layer with a concentration gradient is provided on the first main surface side, i.e., front surface side, with a FLR in which a region including the cell region and the pad region 40 is surrounded by a p-type terminal well layer of a p-type semiconductor, or with a VLD in which the cell region is surrounded by a p-type well layer with a concentration gradient. The number of p-type terminal well layers in the shape of a ring used for the FLR and concentration distribution used for the VLD may be appropriately selected depending on withstand voltage design of the semiconductor device 101. The p-type terminal well layer may be provided over almost the entire pad region 40, and the pad region 40 may be provided with an IGBT cell or a diode cell.

The control pad 41 includes, for example, at least any one of a current sense pad 41a, a Kelvin emitter pad 41b, a gate pad 41c, and temperature sense diode pads 41d, 41e.

The current sense pad 41a is a control pad for detecting a current flowing through the cell region of the semiconductor device 101. The current sense pad 41a is electrically connected to the cell to allow a current to flow through the cell region of the semiconductor device 101 such that a current of a fraction to a fraction of tens of thousandths flowing through the entire cell region flows through a part of the IGBT cell or the diode cell in the cell region.

The Kelvin emitter pad 41b and the gate pad 41c are each a control pad to which gate drive voltage for on-off control of the semiconductor device 101 is applied. The Kelvin emitter pad 41b is electrically connected to the p-type base layer and an $n^+$-type emitter layer of the IGBT cell. The $n^+$-type emitter layer may be called an $n^+$-type source layer. The gate pad 41c is electrically connected to a gate trench electrode of the IGBT cell. The Kelvin emitter pad 41b and the p-type base layer may be electrically connected with a $p^+$ type contact layer interposed therebetween. The temperature sense diode pads 41d, 41e are control pads electrically connected to an anode and a cathode of the temperature sense diode provided in the semiconductor device 101. Voltage between the anode and cathode of the temperature sense diode (not illustrated) provided in the cell region is measured through the temperature sense diode pads 41d, 41e, and temperature of the semiconductor device 101 is measured based on the voltage.

<IGBT Region 10>

Figure 3:
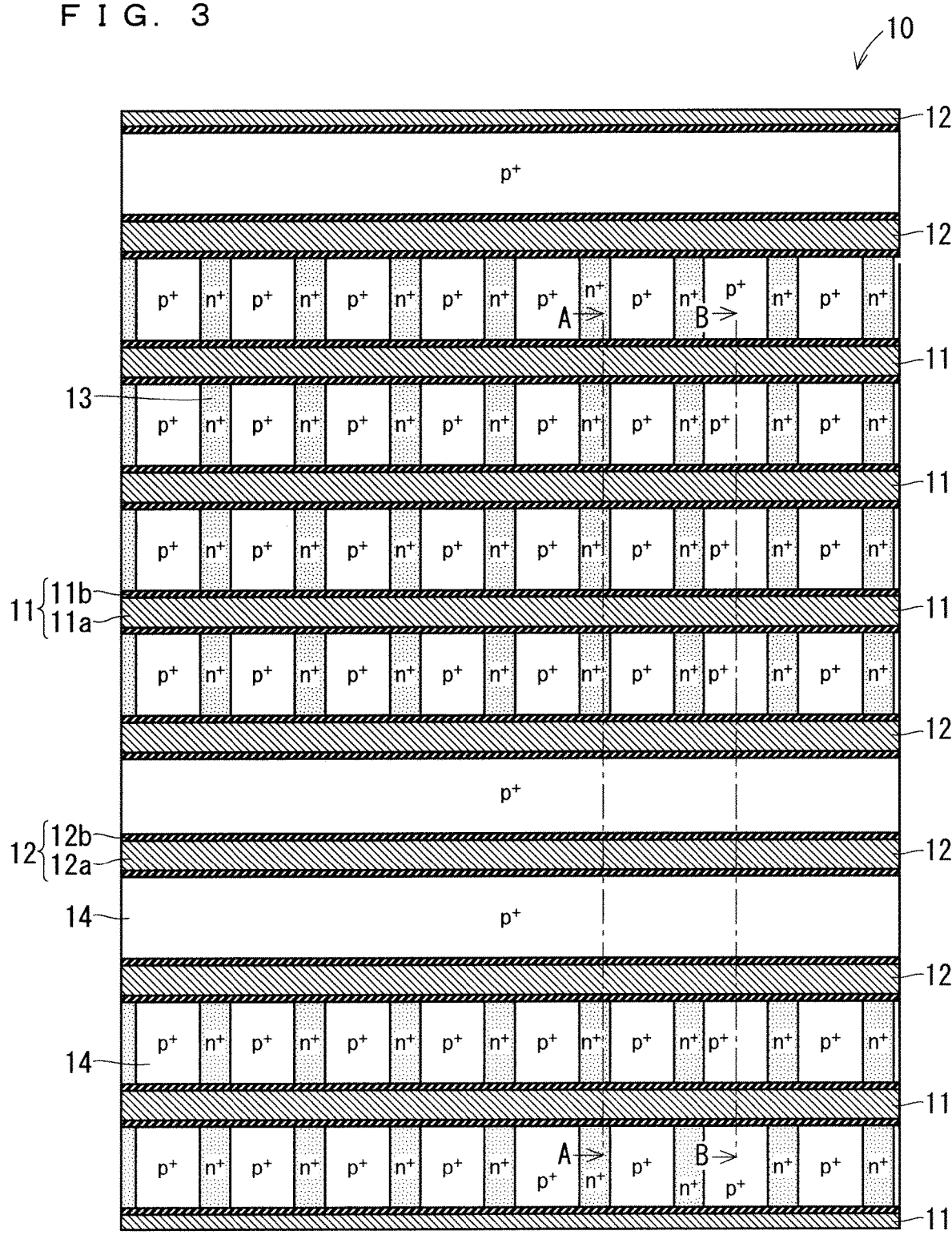
FIG. 3 is a partially enlarged plan view illustrating a structure of an IGBT region of the semiconductor device according to the first preferred embodiment.

FIG. 3 is a partially enlarged plan view illustrating a structure of the IGBT region 10 of a semiconductor device that is an RC-IGBT. Specifically, FIG. 3 is an enlarged view of a region surrounded by a broken line 82 in the semiconductor device 100 illustrated in FIG. 1 or the semiconductor device 101 illustrated in FIG. 2.

Figure 4:
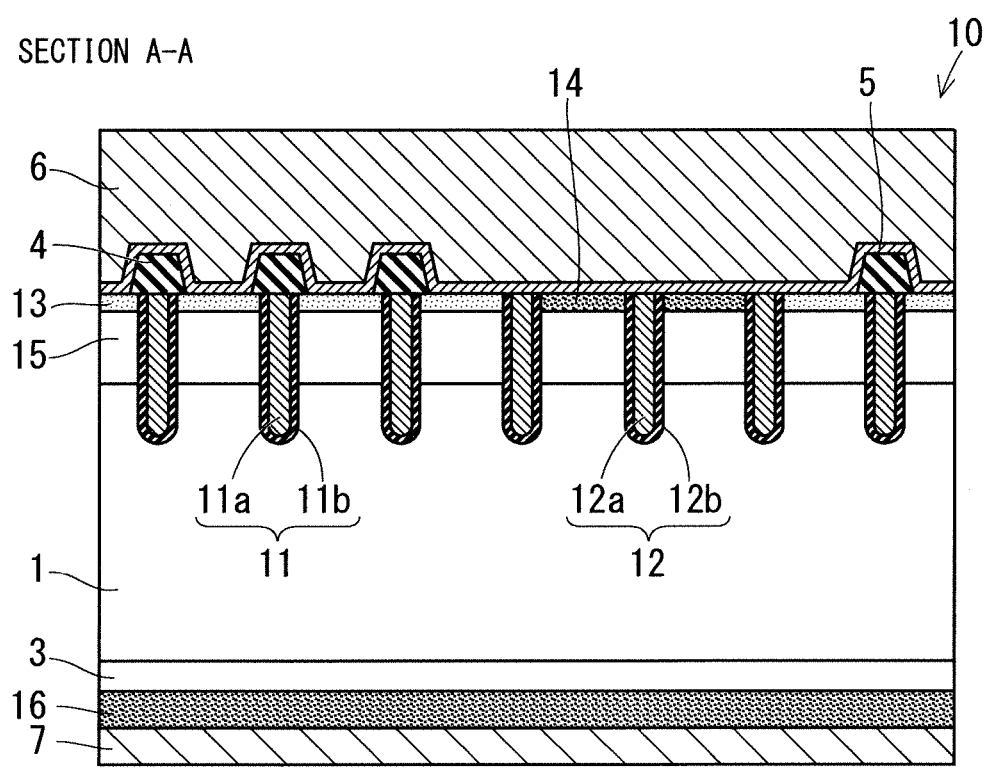

FIGS. 4 and 5 are each a sectional view illustrating a structure of the IGBT region 10 of the semiconductor device that is an RC-IGBT. Specifically, FIG. 4 is a sectional view taken along dot-and-dash line A-A of the semiconductor device 100, 101 illustrated in FIG. 3, and FIG. 5 is a sectional view taken along dot-and-dash line B-B of the semiconductor device 100, 101 illustrated in FIG. 3.

As illustrated in FIG. 3, the IGBT region 10 includes an active trench gate 11 and a dummy trench gate 12 that are each are provided in a stripe shape. The semiconductor device 100 is configured such that the active trench gate 11 and the dummy trench gate 12 extend in a longitudinal direction of the IGBT region 10, and the longitudinal direction of the IGBT region 10 corresponds to a longitudinal direction of each of the active trench gate 11 and the dummy trench gate 12. In contrast, the semiconductor device 101 is configured such that a longitudinal direction and a lateral direction are not particularly distinguished in the IGBT region 10, and a left-right direction in the drawing may correspond to the longitudinal direction of the active trench gate 11 and the dummy trench gate 12, or a vertical direction in the drawing may correspond to the longitudinal direction of the active trench gate 11 and the dummy trench gate 12.

The active trench gate 11 is composed of a gate trench electrode 11a provided in a trench of a semiconductor substrate via a gate trench insulating film 11b. The dummy trench gate 12 is composed of a dummy trench electrode 12a provided in a trench of the semiconductor substrate via a dummy trench insulating film 12b. The gate trench electrode 11a of the active trench gate 11 is electrically connected to the gate pad 41c. The dummy trench electrode 12a of the dummy trench gate 12 is electrically connected to an emitter electrode provided on the first main surface of the semiconductor device 100, 101.

An n$^+$-type emitter layer 13 is provided in contact with the gate trench insulating film 11b on each side of the active trench gate 11 in its width direction. The n$^+$-type emitter layer 13 is a semiconductor layer having, for example, arsenic or phosphorus as n-type impurities, and the n-type impurities have a concentration of 1.0 E+17/cm$^3$ to 1.0 E+20/cm$^3$, for example. The n$^+$-type emitter layer 13 is provided alternately with a p$^+$-type contact layer 14 along an extending direction of the active trench gate 11. The p$^+$-type contact layer 14 is provided between two adjacent dummy trench gates 12 in contact with the dummy trench insulating film 12b. The p$^+$-type contact layer 14 is a semiconductor layer having, for example, boron or aluminum as p-type impurities, and the p-type impurities have a concentration of 1.0 E+15/cm$^3$ to 1.0 E+20/cm$^3$, for example.

As illustrated in FIG. 3, in the IGBT region 10 of the semiconductor device 100, 101, three dummy trench gates 12 disposed side by side are disposed next to three active trench gates 11 disposed side by side. Then, next to the three dummy trench gates 12 disposed side by side, three active trench gates 11 different from the above are disposed side by side. As described above, the IGBT region 10 has a structure in which a set of active trench gates 11 and a set of dummy trench gates 12 are alternately disposed. Although in FIG. 3, the number of active trench gates 11 included in one set of active trench gates 11 is set to three, it may be one or more. The number of dummy trench gates 12 included in one set of dummy trench gates 12 may be one or more, and the number of dummy trench gates 12 may be zero. That is, all of the trench gates provided in the IGBT region 10 may be active trench gates 11.

FIG. 4 is a sectional view of the semiconductor device 100, 101, taken along dot-and-dash line A-A in FIG. 3, and is a sectional view of the IGBT region 10. The semiconductor device 100, 101 includes an n$^-$-type drift layer 1 composed of a semiconductor substrate. The n$^-$-type drift layer 1 is a semiconductor layer having, for example, arsenic or phosphorus as n-type impurities, and the n-type impurities have a concentration of 1.0 E+12/cm$^3$ to 1.0 E+15/cm$^3$, for example. The concentration of n-type impurities in the n$^+$-type emitter layer 13 described above is higher than the concentration of n-type impurities in the n$^-$-type drift layer 1.

In FIG. 4, the semiconductor substrate ranges from the n$^+$-type emitter layer 13 and the p$^+$-type contact layer 14 to a p-type collector layer 16. In FIG. 4, an upper end of the n$^+$-type emitter layer 13 and the p$^+$-type contact layer 14 in the drawing is referred to as the first main surface being the side of the first main surface of the semiconductor substrate, and a lower end of the p-type collector layer 16 in the drawing is referred to as the second main surface being the side of the second main surface of the semiconductor substrate. The first main surface of the semiconductor substrate is the main surface on a front surface side of the semiconductor device 100, 101, and the second main surface of the semiconductor substrate is the main surface on a back surface side of the semiconductor device 100, 101. The semiconductor device 100, 101 includes the n$^-$-type drift layer 1 between the first main surface and the second main surface facing the first main surface in the IGBT region 10 of the cell region. The semiconductor substrate may be configured including, for example, at least one of a wafer and an epitaxial growth layer. The semiconductor substrate may include a wide bandgap semiconductor (silicon carbide (SiC), gallium nitride (GaN), diamond) capable of stable operation under high temperature.

Although not illustrated, the IGBT region 10 may include an n-type carrier storage layer that is provided on the first main surface side of the n$^-$-type drift layer 1, and that has a higher concentration of n-type impurities than the n$^-$-type drift layer 1. Providing the n-type carrier storage layer enables reducing electric power loss when a current flows in the IGBT region 10. The n-type carrier storage layer and the n$^-$-type drift layer 1 may be collectively referred to as a drift layer. The n-type carrier storage layer is formed such that n-type impurities are ion-injected into the semiconductor substrate constituting the n$^-$-type drift layer 1, and then injected n-type impurities are spread into the semiconductor substrate being the n$^-$-type drift layer 1 by annealing.

A p-type base layer 15 is provided on the first main surface side of n$^-$-type drift layer 1. In the structure in which the n-type carrier storage layer is provided, the p-type base layer 15 is provided on the first main surface side of the n-type carrier storage layer. The p-type base layer 15 is a semiconductor layer having, for example, boron or aluminum as p-type impurities, and the p-type impurities have a concentration of 1.0 E+12/cm$^3$ to 1.0 E+19/cm$^3$, for example. The p-type base layer 15 is in contact with the gate trench insulating film 11b of the active trench gate 11. In the example of FIG. 4, the p-type base layer 15 is also in contact with the dummy trench insulating film 12b of the dummy trench gate 12.

The n$^+$-type emitter layer 13 in contact with the gate trench insulating film 11b of the active trench gate 11 is provided in a part of a region on the first main surface side of the p-type base layer 15, and the p$^+$-type contact layer 14 is selectively provided in the other of the region on the first main surface side of the p-type base layer 15. The n$^+$-type emitter layer 13 and the p$^+$-type contact layer 14 constitute the first main surface of the semiconductor substrate. The p$^+$-type contact layer 14 is a region having a higher concentration of p-type impurities than the p-type base layer 15. When the p$^+$-type contact layer 14 and the p-type base layer 15 need to be distinguished from each other, they may be referred to individually. Alternatively, the p$^+$-type contact layer 14 and the p-type base layer 15 may be collectively referred to as a p-type base layer. The p$^+$-type contact layer 14 and the n$^+$-type emitter layer 13 are connected to an emitter electrode 6 via a barrier metal 5.

In the semiconductor device 100, 101, an n-type buffer layer 3 having a higher concentration of n-type impurities than the n$^-$-type drift layer 1 is provided on the second main surface side of the n$^-$-type drift layer 1. The n-type buffer layer 3 is provided to prevent a depletion layer extending from the p-type base layer 15 toward the second main surface from punching through when the semiconductor device 100, 101 is turned off. The n-type buffer layer 3 may be formed by injecting phosphorus (P) or a proton (H$^+$), for example, or may be formed by injecting both phosphorus (P) and a proton (H$^+$). The n-type buffer layer 3 includes n-type impurities having a concentration of 1.0 E+12/cm$^3$ to 1.0 E+18/cm$^3$, for example. The semiconductor device 100, 101 may be configured such that the n-type buffer layer 3 is not provided and the n$^-$-type drift layer 1 is provided in a region of the n-type buffer layer 3 illustrated in FIG. 4. The n-type buffer layer 3 and the n$^-$-type drift layer 1 may be collectively referred to as a drift layer.

In the semiconductor device 100, 101, the p-type collector layer 16 is provided on the second main surface side of the n-type buffer layer 3. That is, the p-type collector layer 16 is provided between the n$^-$-type drift layer 1 and the second main surface. The p-type collector layer 16 may be referred to as a p$^+$-type collector layer. The p-type collector layer 16 is a semiconductor layer having, for example, boron or aluminum as p-type impurities, and the p-type impurities have a concentration of 1.0 E+16/cm$^3$ to 1.0 E+20/cm$^3$, for example. The p-type collector layer 16 constitutes the second main surface of the semiconductor substrate. The p-type collector layer 16 may be provided not only in the IGBT region 10 but also in the terminal region 30. The p-type collector layer 16 is connected to a collector electrode 7.

As illustrated in FIG. 4, the IGBT region 10 of the semiconductor device 100, 101 is provided with a trench that passes through the p-type base layer 15 from the first main surface of the semiconductor substrate and reaches the n$^-$-type drift layer 1. The active trench gate 11 is composed of the gate trench electrode 11a provided in each of some trenches via the gate trench insulating film 11b. The gate trench electrode 11a faces the n$^-$-type drift layer 1 with the gate trench insulating film 11b interposed therebetween. The dummy trench gate 12 is composed of the dummy trench electrode 12a provided in each of some trenches via the dummy trench insulating film 12b. The dummy trench electrode 12a faces the n$^-$-type drift layer 1 with the dummy trench insulating film 12b interposed therebetween.

The gate trench insulating film 11b of the active trench gate 11 is in contact with the p-type base layer 15 and the n$^+$-type emitter layer 13. When gate drive voltage is applied to the gate trench electrode 11a, a channel is formed in the p-type base layer 15 in contact with the gate trench insulating film 11b of the active trench gate 11.

As illustrated in FIG. 4, an interlayer insulating film 4 is provided on the gate trench electrode 11a of the active trench gate 11. The barrier metal 5 capable of reducing contact resistance is provided on a region where the interlayer insulating film 4 is not provided on the first main surface of the semiconductor substrate and on the interlayer insulating film 4. The barrier metal 5 may be, for example, a conductor containing titanium (Ti), specifically, titanium nitride, or TiSi obtained by alloying titanium and silicon (Si). The barrier metal 5 may be formed by silicidation. As illustrated in FIG. 4, the barrier metal 5 is in ohmic contact with the n$^+$-type emitter layer 13, the p$^+$-type contact layer 14, and the dummy trench electrode 12a, and is electrically connected to the n$^+$-type emitter layer 13, the p$^+$-type contact layer 14 and the dummy trench electrode 12a. Then, the barrier metal 5 is electrically insulated from the gate trench electrode 11a by the interlayer insulating film 4.

An emitter electrode 6 is provided on the barrier metal 5. The emitter electrode 6 may be formed of, for example, an aluminum alloy such as an aluminum silicon alloy (Al—Si based alloy), and may be composed of multiple layers of metal films in which plating films are formed on an electrode formed of the aluminum alloy by electroless plating or electrolytic plating. The plating films formed by electroless plating or electrolytic plating may be each a nickel (Ni) plating film, for example. When there is a fine region such as between adjacent interlayer insulating films 4 where good embedding cannot be obtained with the emitter electrode 6, a tungsten film having better embedding properties than the emitter electrode 6 may be disposed in the fine region to provide the emitter electrode 6 on the tungsten film. The emitter electrode 6 may be provided on the n$^+$-type emitter layer 13, the p$^+$-type contact layer 14, and the dummy trench electrode 12a without providing the barrier metal 5. The barrier metal 5 may be provided only on an n-type semiconductor layer such as the n$^+$-type emitter layer 13. The barrier metal 5 and the emitter electrode 6 may be collectively referred to as an emitter electrode. As described above, the emitter electrode 6 may be provided on the first main surface of the semiconductor substrate.

Although FIG. 4 illustrates a structure in which the interlayer insulating film 4 is not provided on the dummy trench electrode 12a of the dummy trench gate 12, the interlayer insulating film 4 may be provided on the dummy trench electrode 12a of the dummy trench gate 12 in a sectional portion of FIG. 4. When the interlayer insulating film 4 is provided on the dummy trench electrode 12a of the dummy trench gate 12 in the sectional portion of FIG. 4, the emitter electrode 6 and the dummy trench electrode 12a may be electrically connected in another sectional portion.

A collector electrode 7 is provided on the second main surface side of the p-type collector layer 16. As with the emitter electrode 6, the collector electrode 7 may be composed of an aluminum alloy or multiple layers of an aluminum alloy with a plating film. The collector electrode 7 may be different in structure from the emitter electrode 6. The collector electrode 7 is in ohmic contact with the p-type collector layer 16 and is electrically connected to the p-type collector layer 16. As described above, the collector electrode 7 may be provided on the second main surface of the semiconductor substrate.

FIG. 5 is a sectional view of the semiconductor device 100, 101, taken along dot-and-dash line B-B in FIG. 3, and is a sectional view of the IGBT region 10. Unlike the sectional portion taken along dot-and-dash line A-A illustrated in FIG. 4, the sectional portion taken along dot-and-dash line B-B of FIG. 5 does not include the n$^+$-type emitter layer 13 that is in contact with the active trench gate 11 and is provided on the first main surface side of the semiconductor substrate. That is, the n$^+$-type emitter layer 13 illustrated in FIG. 3 is selectively provided on the first main surface side of the p-type base layer. The p-type base layer referred to here includes the p-type base layer 15 and the p$^+$-type contact layer 14.

<Diode Region 20>

Figure 6:
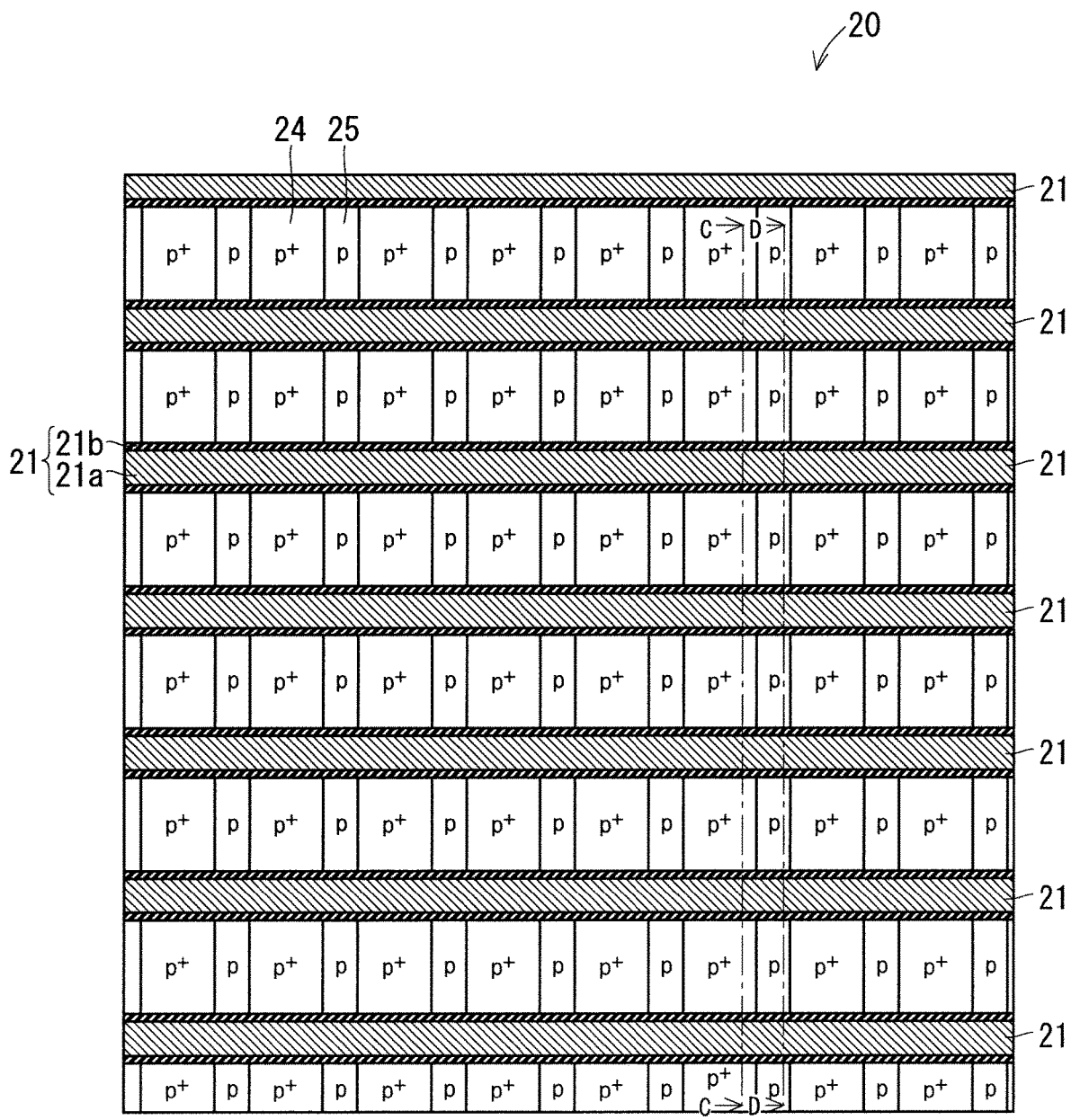
FIG. 6 is a partially enlarged plan view illustrating a structure of a diode region of the semiconductor device according to the first preferred embodiment.

FIG. 6 is a partially enlarged plan view illustrating a structure of the diode region 20 of the semiconductor device that is an RC-IGBT. Specifically, FIG. 6 is an enlarged view of a region surrounded by a broken line 83 in the semiconductor device 100, 101 illustrated in FIG. 1.

Figure 7:
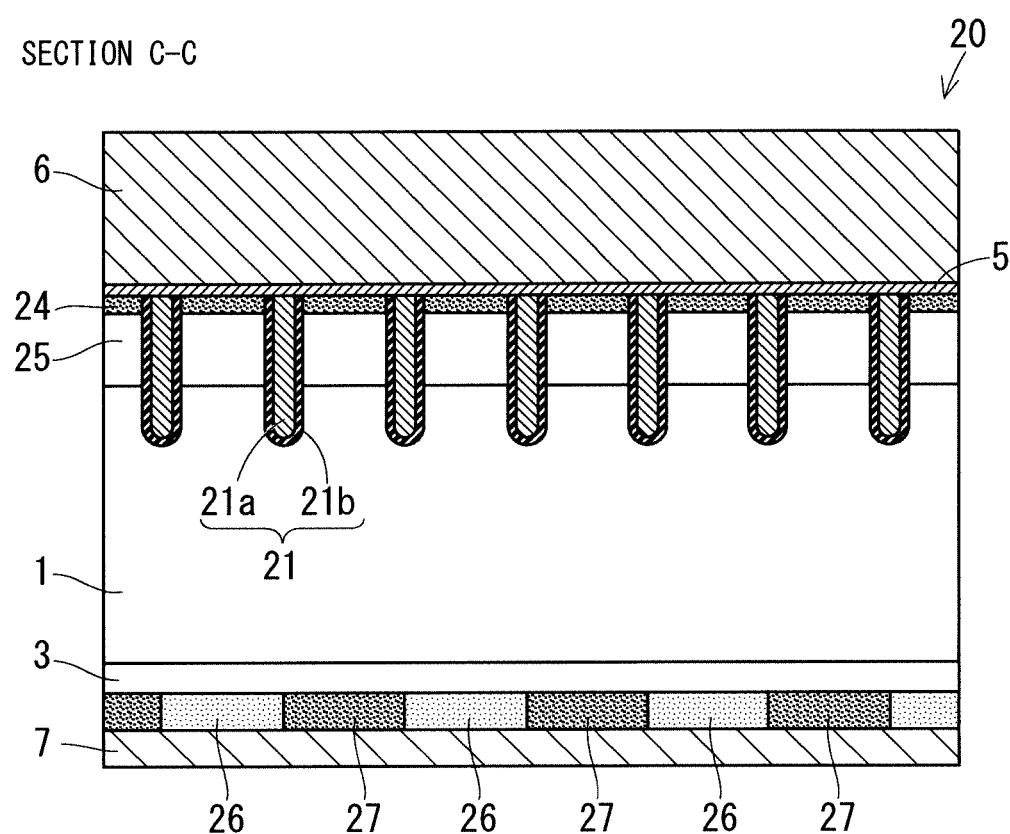
FIGS. 7 and 8 are each a sectional view illustrating a structure of the diode region of the semiconductor device according to the first preferred embodiment.
Figure 8:
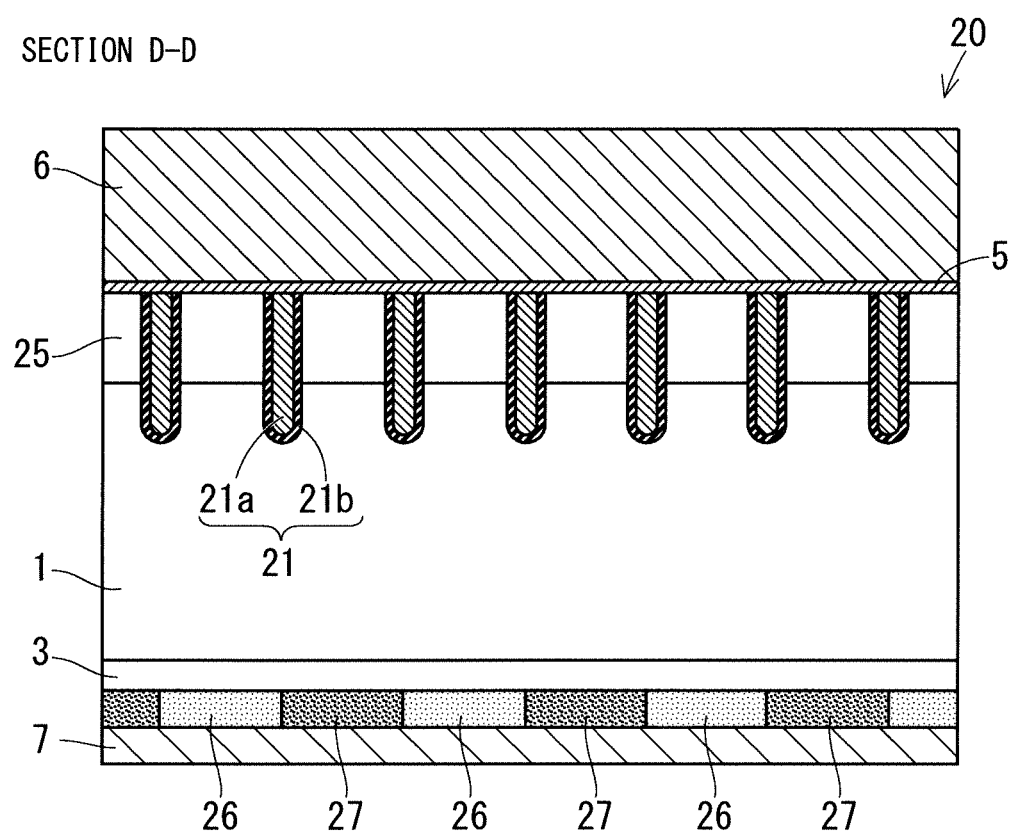

FIGS. 7 and 8 are each a sectional view illustrating the structure of the diode region 20 of the semiconductor device that is an RC-IGBT. Specifically, FIG. 7 is a sectional view taken along dot-and-dash line C-C of the semiconductor device 100, 101 illustrated in FIG. 6, and FIG. 8 is a sectional view taken along dot-and-dash line D-D of the semiconductor device 100, 101 illustrated in FIG. 6.

Diode trench gates 21 are provided along the first main surface of the semiconductor device 100, 101 while extending from one end side of the diode region 20 in the cell region toward the other end side facing the one end side. A diode trench gate 21 is composed of a diode trench electrode 21a provided in a trench in the diode region 20 via a diode trench insulating film 21b. The diode trench electrode 21a faces the n"-type drift layer 1 with the diode trench insulating film 21b interposed therebetween.

Between two adjacent diode trench gates 21, a p$^+$-type contact layer 24 and a p-type anode layer 25 having a lower concentration of p-type impurities than the p$^+$-type contact layer 24 are provided. The p$^+$-type contact layer 24 is a semiconductor layer having, for example, boron or aluminum as p-type impurities, and the p-type impurities have a concentration of 1.0 E+15/cm$^3$ to 1.0 E+20/cm$^3$, for example. The p-type anode layer 25 is a semiconductor layer having, for example, boron or aluminum as p-type impurities, and the p-type impurities have a concentration of 1.0 E+12/cm³ to 1.0 E+19/cm³, for example. The p⁺-type contact layer 24 and the p-type anode layer 25 are alternately provided in a longitudinal direction of the diode trench gate 21.

FIG. 7 is a sectional view of the semiconductor device 100, 101, taken along dot-and-dash line C-C in FIG. 6, and is a sectional view of the diode region 20. The semiconductor device 100, 101 includes the diode region 20 that also has the n⁻-type drift layer 1 composed of a semiconductor substrate as with the IGBT region 10. The n⁻-type drift layer 1 in the diode region 20 and the n⁻-type drift layer 1 in the IGBT region 10 are continuously and integrally formed in an identical semiconductor substrate.

In FIG. 7, the semiconductor substrate ranges from the p⁺-type contact layer 24 to an n⁺-type cathode layer 26. In FIG. 7, an upper end of the p⁺-type contact layer 24 in the drawing is referred to as the first main surface of the semiconductor substrate, and a lower end of the n⁺-type cathode layer 26 in the drawing is referred to as the second main surface of the semiconductor substrate. The first main surface of the diode region 20 and the first main surface of the IGBT region 10 are included in the same surface, and the second main surface of the diode region 20 and the second main surface of the IGBT region 10 are included in the same surface.

As illustrated in FIG. 7 and as with the IGBT region 10, in the diode region 20, the n-type buffer layer 3 is provided on the second main surface side of n⁻-type drift layer 1. Although not illustrated, as with the IGBT region 10, in the diode region 20, the n-type carrier storage layer may be provided on the first main surface side of the n⁻-type drift layer 1.

The n-type carrier storage layer and the n-type buffer layer 3 provided in the diode region 20 may be identical in structure to the n-type carrier storage layer and the n-type buffer layer 3 provided in the IGBT region 10. As in the IGBT region 10, the type drift layer 1, the n-type carrier storage layer, and the n-type buffer layer 3 may be collectively referred to as a drift layer.

The p-type anode layer 25 that is a first anode layer is provided on the first main surface side of n⁻-type drift layer 1. The p-type anode layer 25 is provided between the n⁻-type drift layer 1 and the first main surface. The p-type anode layer 25 is connected to the emitter electrode 6 via the barrier metal 5. The p-type anode layer 25 and the p-type base layer 15 may be simultaneously formed by allowing the p-type anode layer 25 and the p-type base layer 15 in the IGBT region 10 to be identical in concentration of p-type impurities. The p-type anode layer 25 may be configured to have a concentration of p-type impurities that is lower than a concentration of p-type impurities of the p-type base layer 15 in the IGBT region 10 so that the amount of positive holes to be injected into the diode region 20 during diode operation is reduced. When the amount of positive holes to be injected during diode operation is reduced, recovery loss during the diode operation can be reduced.

The p⁺-type contact layer 24 that is a first contact layer is provided on the first main surface side of p-type anode layer 25. The p⁺-type contact layer 24 may have a concentration of p-type impurities that is identical to or different from a concentration of p-type impurities of the p⁺-type contact layer 14 in the IGBT region 10. The p⁺-type contact layer 24 constitutes the first main surface of the semiconductor substrate. The p⁺-type contact layer 24 is a region in which a concentration of p-type impurities is higher than that of the p-type anode layer 25. When the p⁺-type contact layer 24 and the p-type anode layer 25 need to be distinguished, they may be referred to individually. Alternatively, the p⁺-type contact layer 24 and the p-type anode layer 25 may be collectively referred to as a p-type anode layer.

The n⁺-type cathode layer 26 and a p⁺-type carrier discharge layer 27 that is a first carrier discharge layer are provided on the second main surface side of the semiconductor device 100, 101 includes the n-type buffer layer 3. That is, the n⁺-type cathode layer 26 and the p⁺-type carrier discharge layer 27 are provided between the type drift layer 1 and the second main surface.

The n⁺-type cathode layer 26 is a semiconductor layer having, for example, arsenic or phosphorus as n-type impurities, and the n-type impurities have a concentration of 1.0 E+16/cm³ to 1.0 E+21/cm³, for example. The p⁺-type carrier discharge layer 27 is a semiconductor layer having, for example, boron or aluminum as p-type impurities, and the p-type impurities have a concentration of 1.0 E+16/cm³ to 1.0 E+20/cm³, for example. The p⁺-type carrier discharge layer 27 is provided adjacent to the n⁺-type cathode layer 26 in an in-plane direction of the semiconductor substrate. In the example of FIG. 7, the p⁺-type carrier discharge layer 27 is surrounded by the n⁺-type cathode layer 26. The n⁺-type cathode layer 26 and the p⁺-type carrier discharge layer 27 constitute the second main surface of the semiconductor substrate, and are connected to the collector electrode 7.

The p⁺-type carrier discharge layer 27 may be formed by selectively injecting p-type impurities into a back surface of the diode region 20 using a photoresist or the like. Alternatively, the p⁺-type carrier discharge layer 27 may be partially formed in the back surface of the diode region 20 using a difference in concentration between p-type impurities injected into the entire back surface of the diode region 20, and n-type impurities in the n⁺-type cathode layer 26 that are subsequently injected into the back surface thereof.

As illustrated in FIG. 7, the diode region 20 of the semiconductor device 100, 101 is provided with a trench that passes through the p-type anode layer 25 from the first main surface of the semiconductor substrate and reaches the n⁻-type drift layer 1. The diode trench gate 21 is composed of the diode trench electrode 21a provided in a trench in the diode region 20 via the diode trench insulating film 21b. The diode trench electrode 21a faces the n⁻-type drift layer 1 with the diode trench insulating film 21b interposed therebetween.

As illustrated in FIG. 7, the barrier metal 5 is provided on the diode trench electrode 21a and the p⁺-type contact layer 24. The barrier metal 5 is in ohmic contact with the diode trench electrode 21a and the p⁺-type contact layer 24, and is electrically connected to the diode trench electrode 21a and the p⁺-type contact layer 24. The barrier metal 5 may be identical in structure to the barrier metal 5 in the IGBT region 10.

An emitter electrode 6 is provided on the barrier metal 5. The emitter electrode 6 provided in the diode region 20 is continuously formed with the emitter electrode 6 provided in the IGBT region 10. As in the case of the IGBT region 10, the diode trench electrode 21a and the p⁺-type contact layer 24 may be brought into ohmic contact with the emitter electrode 6 without providing the barrier metal 5. That is, the emitter electrode 6 may be substantially provided on the first main surface of the semiconductor substrate.

Although FIG. 7 illustrates a structure in which the interlayer insulating film 4 as illustrated in FIG. 4 is not provided on the diode trench electrode 21a of the diode trench gate 21, the interlayer insulating film 4 may be provided on the trench electrode 21a in a sectional portion of FIG. 7. When the interlayer insulating film 4 is provided on the diode trench electrode 21a of the diode trench gate 21 in the sectional portion of FIG. 7, the emitter electrode 6 and the diode trench electrode 21a may be electrically connected in another sectional portion. The diode trench electrode 21a, which is not electrically connected to the emitter electrode 6, may be electrically connected to the gate pad 41c.

The collector electrode 7 is provided on the second main surface side of the n$^+$-type cathode layer 26. As with the emitter electrode 6, the collector electrode 7 in the diode region 20 is continuously formed with the collector electrode 7 provided in the IGBT region 10. The collector electrode 7 is in ohmic contact with the n$^+$-type cathode layer 26 and is electrically connected to the n$^+$-type cathode layer 26. That is, the collector electrode 7 may be provided on the second main surface of the semiconductor substrate.

FIG. 8 is a sectional view of the semiconductor device 100, 101, taken along dot-and-dash line D-D in FIG. 6, and is a sectional view of the diode region 20. Unlike the sectional portion taken along dot-and-dash line C-C illustrated in FIG. 7, the p$^+$-type contact layer 24 is not provided between the p-type anode layer 25 and the barrier metal 5 in the sectional portion taken along dot-and-dash line D-D of FIG. 8, and the p-type anode layer 25 is the first main surface of the semiconductor substrate. That is, the p$^+$-type contact layer 24 illustrated in FIG. 7 is selectively provided on the first main surface side of the p-type anode layer 25. In FIG. 8, the p-type anode layer 25 is connected to the emitter electrode 6 via the barrier metal 5.

<Structure of Boundary Region Between IGBT Region 10 and Diode Region 20>

Figure 9:
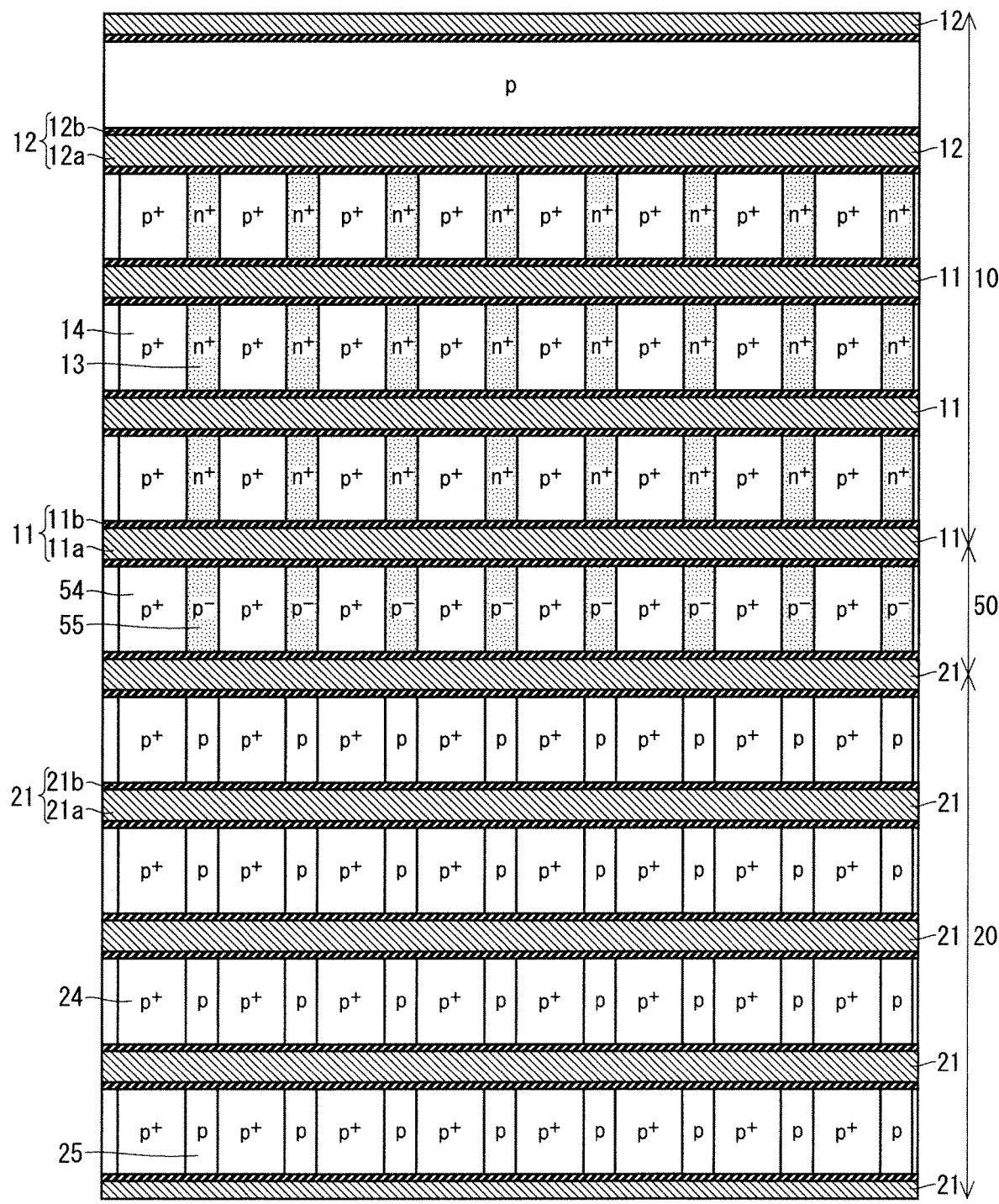
FIGS. 9 and 10 are each a partially enlarged plan view illustrating a structure of a boundary region between the IGBT region and the diode region of the semiconductor device according to the first preferred embodiment.
Figure 10:
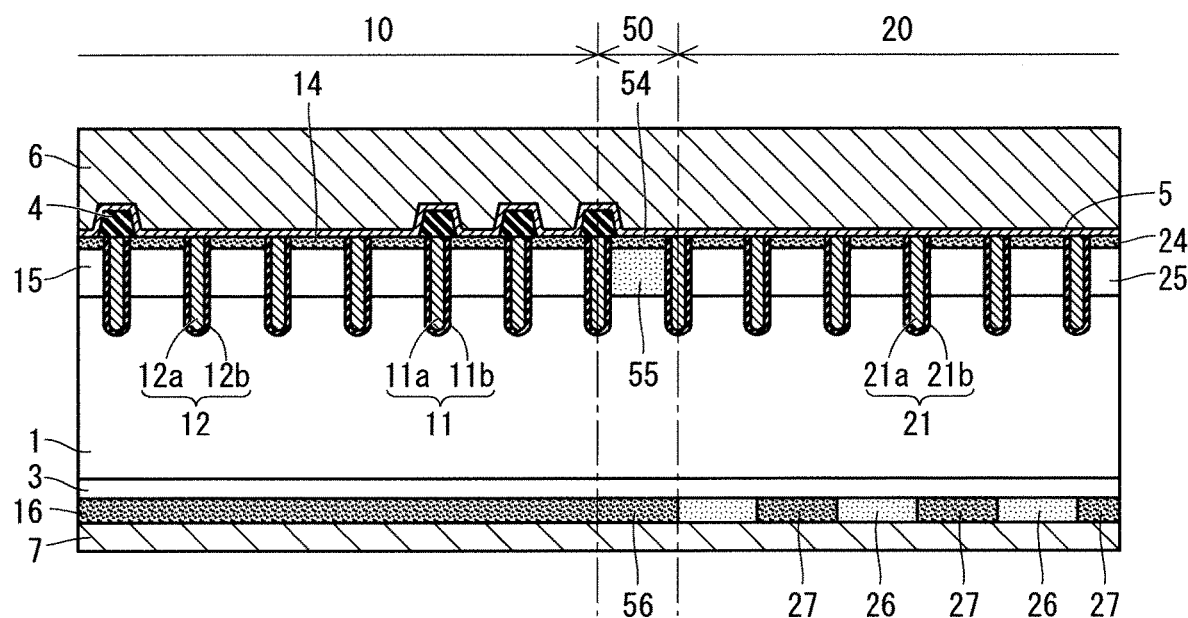

FIGS. 9 and 10 are respectively a plan view and a sectional view, illustrating a structure of a boundary region 50 between the IGBT region 10 and the diode region 20 of the semiconductor device according to the first preferred embodiment. Specifically, FIG. 9 is a plan view near dot-and-dash line E-E in each of the semiconductor devices 100, 101 illustrated in FIGS. 1 and 2, respectively, and FIG. 10 is a sectional view taken along dot-and-dash line E-E. To avoid duplicated description, the contents described in the IGBT region 10 and the diode region 20, particularly the contents such as abbreviation and names of components, are appropriately eliminated.

FIGS. 9 and 10 each illustrate not only the IGBT region 10 and the diode region 20, but also the boundary region 50 between the IGBT region 10 and the diode region 20. In the present first preferred embodiment, the boundary region 50 is located between a trench gate of the IGBT region 10 and a trench gate of the diode region 20. The IGBT region 10, the diode region 20, and the boundary region 50 are provided on the semiconductor substrate in the in-plane direction of the semiconductor substrate. The boundary region 50 is here provided between a set of adjacent trench gates, but may be provided in a region straddling multiple trench gates, or may be provided only in a part between a set of adjacent trench gates.

A p$^-$-type anode layer 55 that is a second anode layer is provided on the first main surface side of the n$^-$-type drift layer 1 in the boundary region 50. The p$^-$-type anode layer 55 is a semiconductor layer having, for example, boron or aluminum as p-type impurities. The p$^-$-type anode layer 55 in the boundary region 50 has a concentration of p-type impurities that is lower than a concentration of p-type impurities in the p-type anode layer 25 in the diode region 20.

A p$^+$-type contact layer 54 that is a second contact layer is provided on the first main surface side of the p$^-$-type anode layer 55. The p$^+$-type contact layer 54 is a semiconductor layer having, for example, boron or aluminum as p-type impurities. The p$^+$-type contact layer 54 may have a concentration of p-type impurities that is identical to or different from a concentration of p-type impurities of the p$^+$-type contact layer 14 in the IGBT region 10. The p$^+$-type contact layer 54 is a region having a higher concentration of p-type impurities than the p$^-$-type anode layer 55.

The n-type drift layer 1 in the boundary region 50 is provided on the second main surface side of the n-type buffer layer 3. Although not illustrated, as with the IGBT region 10, the boundary region 50 includes the n$^-$-type drift layer 1 that may be provided on the first main surface side of the n-type carrier storage layer.

A p-type collector layer 56 that is a collector layer is provided on the second main surface side of the n-type buffer layer 3. The p-type collector layer 56 is a semiconductor layer having, for example, boron or aluminum as p-type impurities. The p-type collector layer 56 may have a concentration of p-type impurities that is identical to or different from a concentration of p-type impurities of the p-type collector layer 16 in the IGBT region 10. The p-type collector layer 56 is provided adjacent to the p-type collector layer 16 in the IGBT region 10 and the n$^+$-type cathode layer 26 in the diode region 20 in the in-plane direction of the semiconductor substrate.

In the section of FIG. 10, the semiconductor substrate in the boundary region 50 ranges from the p$^+$-type contact layer 54 to the p-type collector layer 56. The p$^+$-type contact layer 54 is included in the first main surface of the semiconductor substrate, and the p-type collector layer 56 is included in the second main surface of the semiconductor substrate. In a section different from that of FIG. 10, the semiconductor substrate in the boundary region 50 ranges from the p$^-$-type anode layer 55 to the p-type collector layer 56. The p$^-$-type anode layer 55 is included in the first main component of the semiconductor substrate, and the p-type collector layer 56 is included in the second main surface of the semiconductor substrate.

Even in the boundary region 50, the emitter electrode 6 is provided on the first main surface of the semiconductor substrate, and the p$^+$-type contact layer 54 and the p$^-$-type anode layer 55 are connected to the emitter electrode 6 via the barrier metal 5. Even in the boundary region 50, the collector electrode 7 is provided on the second main surface of the semiconductor substrate, and the p-type collector layer 56 is connected to the collector electrode 7.

<Terminal Region 30>

Figure 12:
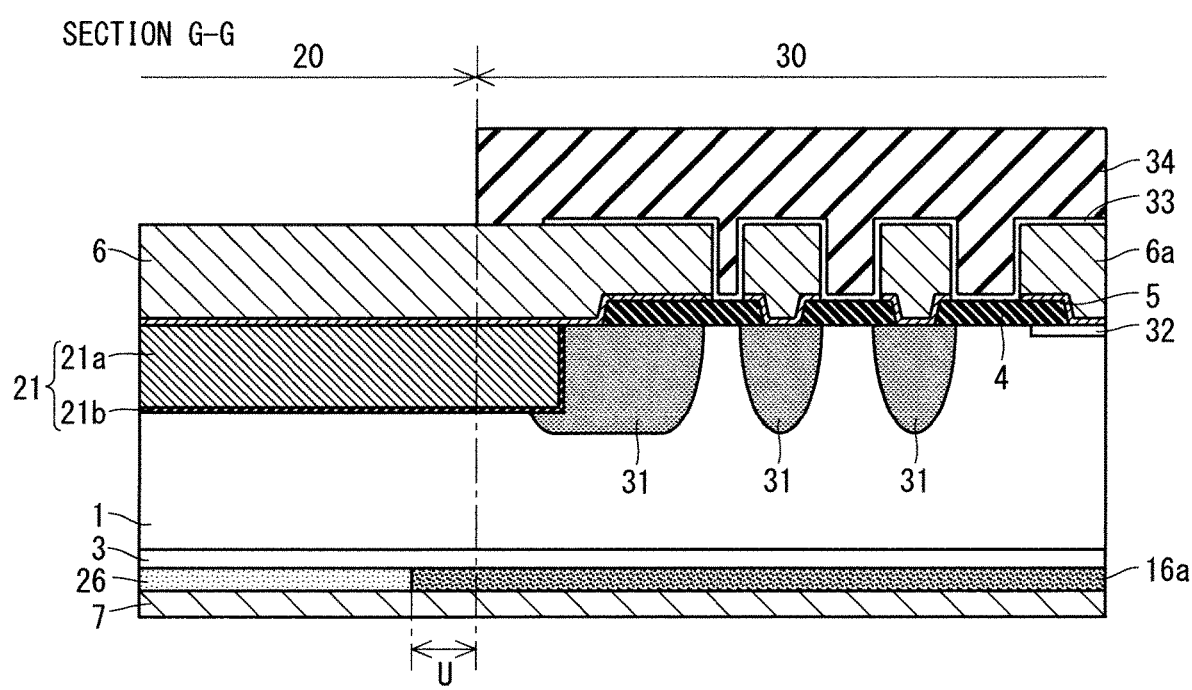

FIGS. 11 and 12 are each a sectional view illustrating a structure of a terminal region of the semiconductor device that is an RC-IGBT. Specifically, FIG. 11 is a sectional view taken along dot-and-dash line F-F in FIG. 1 or 2, and is a sectional view from the IGBT region 10 to the terminal region 30. FIG. 12 is a sectional view taken along dot-and-dash line G-G in FIG. 1, and is a sectional view from the diode region 20 to the terminal region 30.

As shown in FIGS. 11 and 12, the terminal region 30 of the semiconductor device 100 has an n$^-$-type drift layer 1 between the first main surface and the second main surface of the semiconductor substrate. The first main surface and the second main surface in the terminal region 30, and the first main surface and the second main surface in the IGBT region 10 and the diode region 20 are included in the same surface. The n$^-$-type drift layer 1 in the terminal region 30 is identical in structure to the n$^-$-type drift layer 1 in each of the IGBT region 10 and the diode region 20, and is continuously and integrally formed with the n⁻-type drift layer 1 in each of them.

On the first main surface side of the n⁻-type drift layer 1, i.e., between the first main surface of the semiconductor substrate and the n⁻-type drift layer 1, a p-type terminal well layer 31 is selectively provided. The p-type terminal well layer 31 is a semiconductor layer having, for example, boron or aluminum as p-type impurities, and the p-type impurities have a concentration of 1.0 E+14/cm³ to 1.0 E+19/cm³, for example. The p-type terminal well layer 31 is provided surrounding the cell region including the IGBT region 10 and the diode region 20. Multiple p-type terminal well layers 31 are each provided in the shape of a ring, and the number of p-type terminal well layers 31 to be provided is appropriately selected depending on withstand voltage design of the semiconductor device 100, 101. Additionally, an n⁺-type channel stopper layer 32 is provided on an edge side outward of the p-type terminal well layers 31, and the n⁺-type channel stopper layer 32 surrounds the p-type terminal well layers 31 in plan view.

Between the n⁻-type drift layer 1 and the second main surface of the semiconductor substrate in the terminal region 30, a p-type terminal collector layer 16a is provided. The p-type terminal collector layer 16a is continuously and integrally formed with the p-type collector layer 16 provided in the IGBT region 10 of the cell region. Thus, the p-type collector layer 16 including the p-type terminal collector layer 16a may be referred to as a p-type collector layer.

In a structure in which the diode region 20 is provided adjacent to the terminal region 30 as in the semiconductor device 100 illustrated in FIG. 1, the p-type terminal collector layer 16a is provided having an end portion close to the diode region 20, the end portion protruding toward the diode region 20 by only a distance U as illustrated in FIG. 12. This kind of structure enables increasing a distance between the n⁺-type cathode layer 26 and the p-type terminal well layer 31 in the diode region 20, so that the p-type terminal well layer 31 can be prevented from operating as an anode of a diode. The distance U may be, for example, 100 μm.

The collector electrode 7 is provided on the second main surface of the semiconductor substrate. The collector electrode 7 is continuously and integrally formed from the cell region including the IGBT region 10 and the diode region 20 to the terminal region 30.

In contrast, the first main surface of the semiconductor substrate in the terminal region 30 is provided with the emitter electrode 6 extending continuously from the cell region, and a terminal electrode 6a structurally separated from the emitter electrode 6. The emitter electrode 6 and the terminal electrode 6a are electrically connected via a semi-insulating film 33. The semi-insulating film 33 may be, for example, a semi-insulating silicon nitride (sinSiN). The terminal electrode 6a and each of the p-type terminal well layer 31 and the n⁺-type channel stopper layer 32 are electrically connected via a contact hole in the interlayer insulating film 4 provided on the first main surface of the terminal region 30. The terminal region 30 is provided with a terminal protective film 34 covering the emitter electrode 6, the terminal electrode 6a, and the semi-insulating film 33. The terminal protective film 34 is, for example, made of polyimide.

<Method for Manufacturing RC-IGBT>

FIGS. 13A to 20B are each a sectional view illustrating a method for manufacturing a semiconductor device that is an RC-IGBT. FIGS. 13A to 18B are each a diagram illustrating a process of mainly forming a front surface side in the boundary region 50 of FIG. 10 of the semiconductor device 100, 101. FIGS. 19A to 20B are each a diagram illustrating a process of mainly forming a back surface side in the boundary region 50 of FIG. 10 of the semiconductor device 100, 101.

Figure 13A:
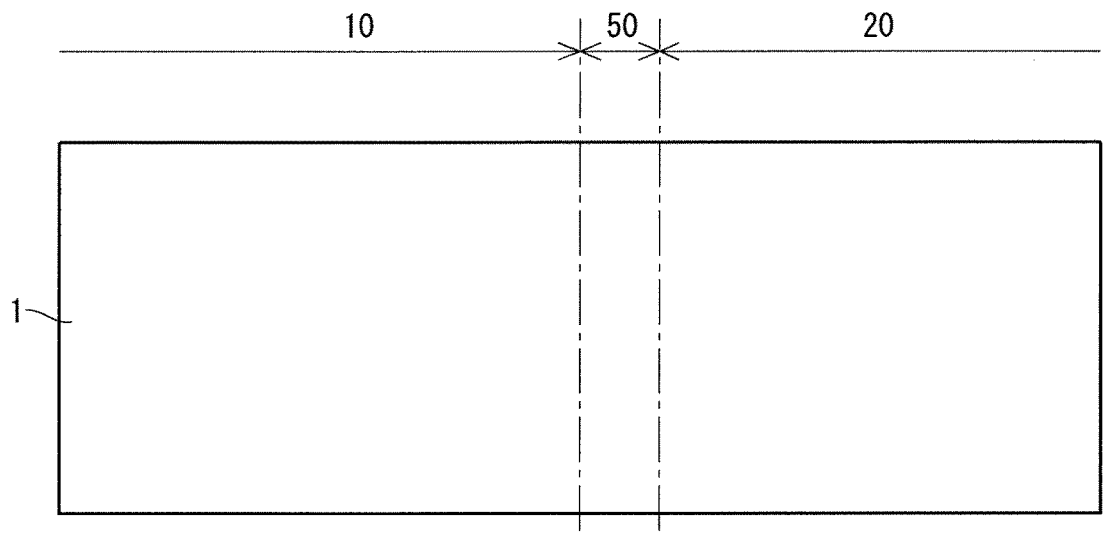
FIGS. 13A-13B, 14-15, 16A-16B, 17A-17B, 18A-18B, 19A-19B and 20A-20B are each a sectional view illustrating a method for manufacturing the semiconductor device according to the first preferred embodiment.

First, as illustrated in FIG. 13A, a semiconductor substrate constituting the type drift layer 1 is prepared. The semiconductor substrate may be, for example, an FZ wafer manufactured by a floating zone (FZ) method, an MCZ wafer manufactured by a magnetic field applied czochralki (MCZ) method, or an n-type wafer containing n-type impurities. The n-type impurities contained in the semiconductor substrate have a concentration that is appropriately selected depending on withstand voltage of the semiconductor device to be manufactured. For example, a semiconductor device with a withstand voltage of 1200V includes n-type impurities having a concentration that is adjusted so that the n⁻-type drift layer 1 constituting the semiconductor substrate has a specific resistance of about 40 to 120 Ω·cm. As illustrated in FIG. 13A, in the step of preparing a semiconductor substrate, the entire semiconductor substrate is the n⁻-type drift layer 1. When p-type or n-type impurity ions are injected into a semiconductor substrate as described above from the first main surface side or second main surface side and then are diffused in the semiconductor substrate by heat treatment or the like, a p-type or n-type semiconductor layer is appropriately formed, and the semiconductor device 100, 101 is manufactured.

As illustrated in FIG. 13A, the semiconductor substrate constituting the n⁻-type drift layer 1 includes a region to be the IGBT region 10, the diode region 20, and the boundary region 50. Although not illustrated, a region to be the terminal region 30 or the like is provided around the region to be the IGBT region 10, the diode region 20, and the boundary region 50. Hereinafter, although a method for manufacturing a structure of the IGBT region 10, the diode region 20, and the boundary region 50 of the semiconductor device 100, 101 will be mainly described, the terminal region 30 and the like of the semiconductor device 100, 101 may be manufactured by a well-known manufacturing method. For example, when an FLR having the p-type terminal well layer 31 as a withstand voltage holding structure is formed in the terminal region 30, p-type impurity ions may be injected to generate the FLR, before processing the IGBT region 10, the diode region 20, and the boundary region 50 of the semiconductor device 100, 101. Alternatively, when p-type impurity ions are injected into the IGBT region 10, the diode region 20, or the boundary region 50 of the semiconductor device 100, the p-type impurity ions may be simultaneously injected to form an FLR.

Figure 13B:
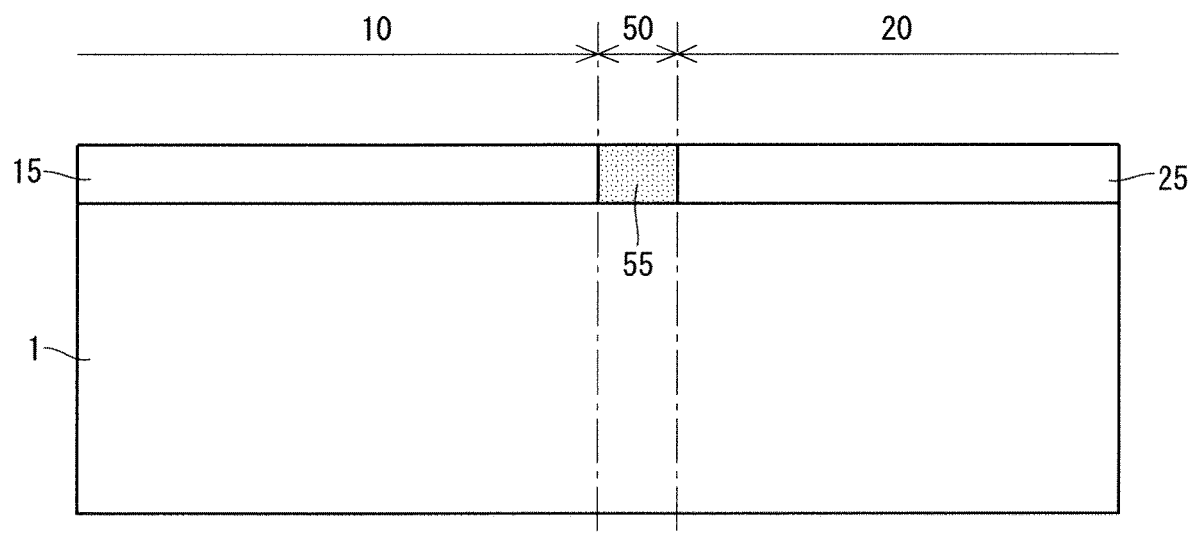

Next, although not illustrated, n-type impurities such as phosphorus (P) are injected into the semiconductor substrate from the first main surface side to form an n-type carrier storage layer as needed. Then, as illustrated in FIG. 13B, p-type impurities such as boron (B) are injected into the semiconductor substrate from the first main surface side to form the p-type base layer 15, the p-type anode layer 25, and the p⁻-type anode layer 55. The n-type carrier storage layer (not illustrated), the p-type base layer 15, the p-type anode layer 25, and the p⁻-type anode layer 55 are formed by injecting impurity ions into the semiconductor substrate and then diffusing the impurity ions by heat treatment. The n-type impurity ions and p-type impurity ions are injected after mask processing is applied on the first main surface of the semiconductor substrate. The mask processing is performed to form a mask on a semiconductor substrate for performing ions injection and etching in a predetermined region of the semiconductor substrate through an opening as follows: a resist is applied on a semiconductor substrate; and an opening is formed in a predetermined region of the resist using a photoengraving technique. The mask processing and injection of ions described above allow the n-type carrier storage layer (not illustrated), the p-type base layer 15, the p-type anode layer 25, and the p⁻-type anode layer 55 to be selectively formed in each the IGBT region 10 and the diode region 20 on the first main surface side. Similarly, the p-type terminal well layer 31 is selectively formed in the terminal region 30.

The p-type impurity ions of the p-type base layer 15 and those of the p-type anode layer 25 may be simultaneously injected. In this case, the p-type base layer 15 and the p-type anode layer 25 are identical in depth and concentration of the p-type impurities to each other. The p-type impurity ions of the p-type base layer 15 and those of the p-type anode layer 25 may be separately injected by mask processing to allow the p-type base layer 15 and the p-type anode layer 25 to be different in depth and concentration of the p-type impurities from each other.

Figure 14:
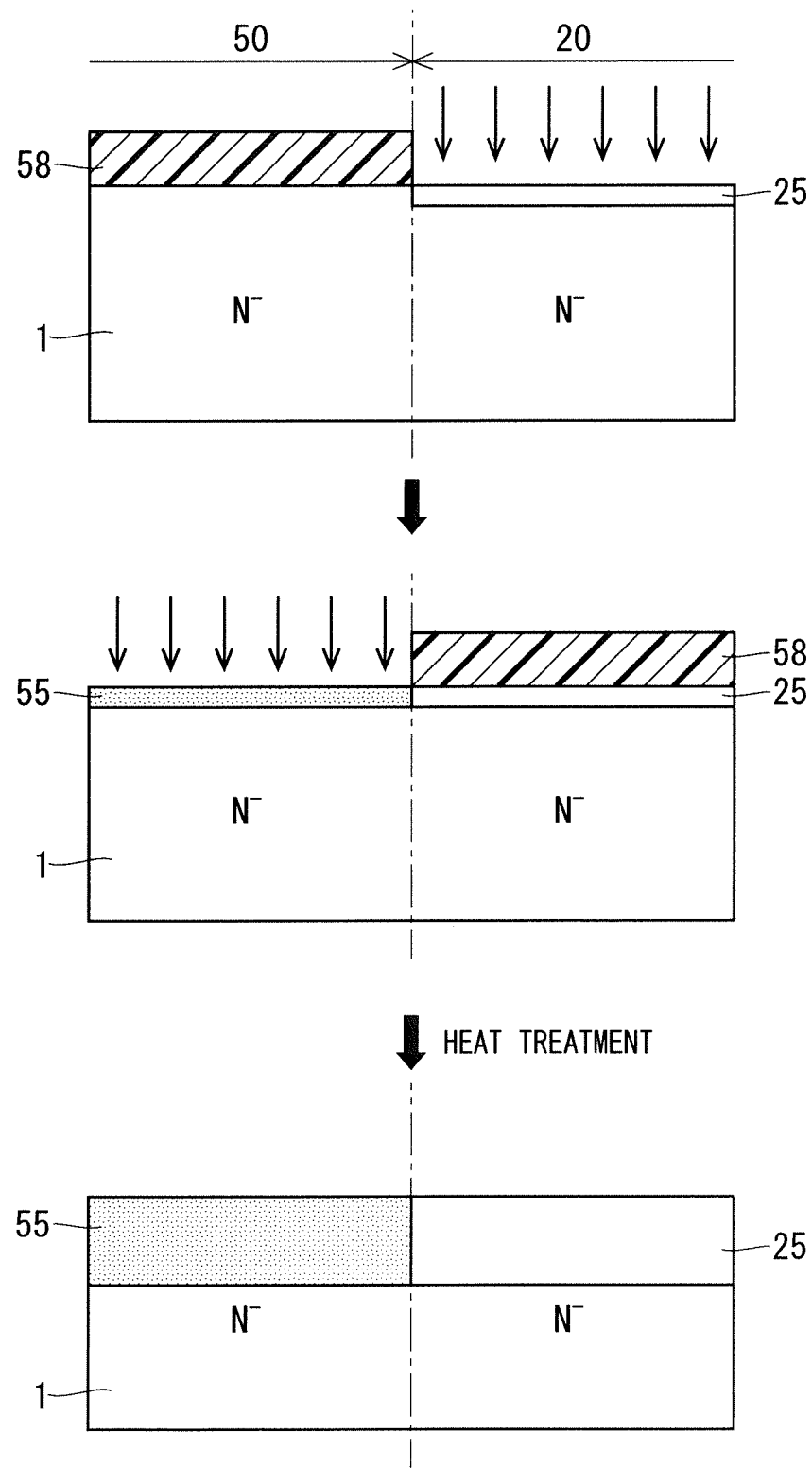

The p-type impurity ions of the p⁻-type anode layer 25 and the p⁻-type anode layer 55, being different in concentration, may be injected separately. For example, as illustrated in FIG. 14, after p-type impurities such as boron are selectively injected into the diode region 20 using a photoresist 58, p-type impurities such as boron are selectively injected into the boundary region 50. At this time, the concentration of the p-type impurities injected into the boundary region 50 is reduced to smaller than the concentration of the p-type impurities injected into the diode region 20. Subsequently, after the photoresist 58 and the like are removed, heat treatment is performed to diffuse the p-type impurities, whereby the p-type anode layer 25 and the p⁻-type anode layer 55 are formed.

Figure 15:
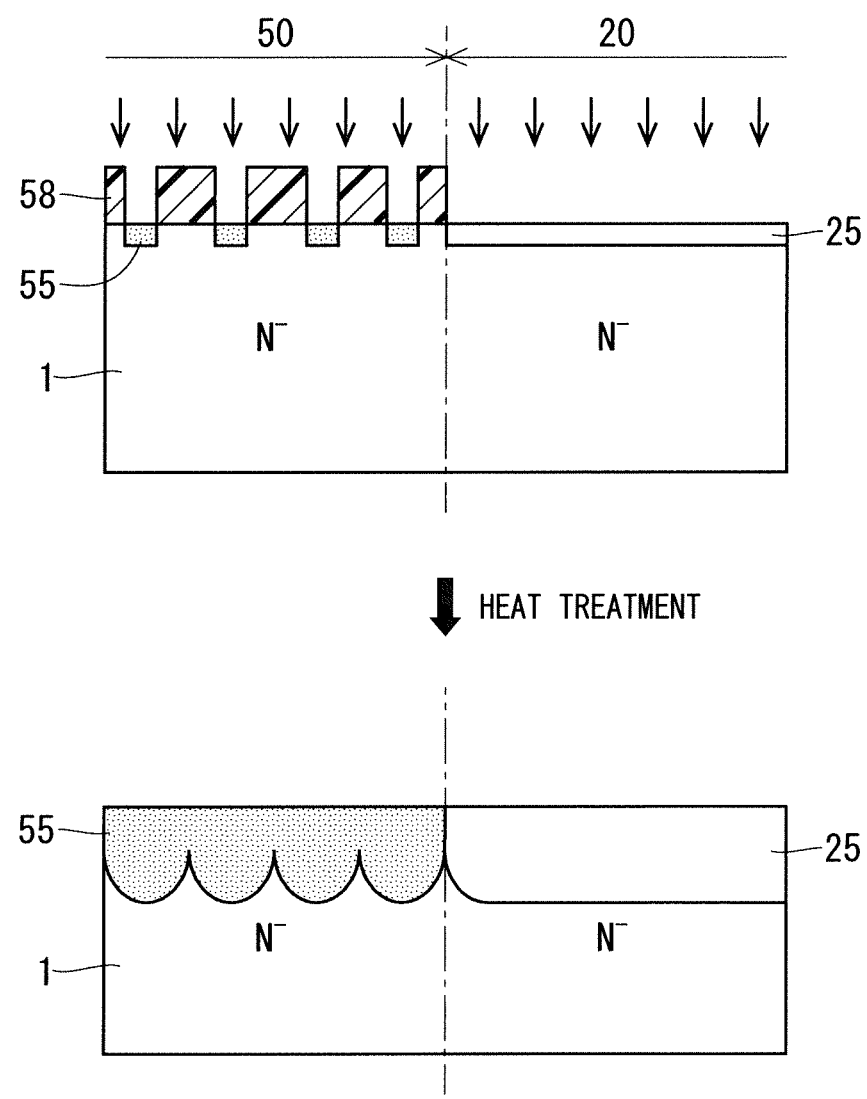

As an alternative to the above, the p-type impurity ions of the p-type anode layer 25 and the p⁻-type anode layer 55, being different in concentration, may be injected simultaneously using masks with different aperture ratios. For example, as illustrated in FIG. 15, the masks with different aperture ratios are used for reducing an aperture ratio of the resist 58 per unit area of in boundary region 50 to smaller than an aperture ratio of the resist 58 per unit area in the diode region 20. In this case, a mesh-shaped mask may be used for one or both of the masks to allow the masks to be different in aperture ratio. As described above, even when the p-type impurities emitted onto the diode region 20 and the boundary region 50 from above the photoresist 58 are identical in concentration, the boundary region 50 can have a lower concentration of the p-type impurities than the diode region 20. Subsequently, after the photoresist 58 and the like are removed, heat treatment is performed to diffuse the p-type impurities as illustrated in FIG. 15, whereby the p-type anode layer 25 and the p⁻-type anode layer 55 are formed.

The p-type impurity ions of the p-type terminal well layer 31 in the terminal region 30 (not illustrated in FIG. 13B) and those of the p-type anode layer 25 may be simultaneously injected. In this case, the p-type terminal well layer 31 and the p-type anode layer 25 are identical in depth and concentration of the p-type impurities to each other. Alternatively, the p-type impurity ions of the p-type terminal well layer 31 and those of the p-type anode layer 25 may be separately injected by mask processing to allow the p-type terminal well layer 31 and the p-type anode layer 25 to be different in depth and concentration of the p-type impurities from each other. Alternatively, when the p-type impurity ions of the p-type terminal well layer 31 and those of the p-type anode layer 25 are simultaneously injected using masks having different aperture ratios, the p-type terminal well layer 31 and the p-type anode layer 25 also can be different in concentration of the p-type impurities from each other. Similarly, p-type impurity ions of each of the p-type terminal well layer 31, the p-type base layer 15, the p-type anode layer 25, and the p⁻-type anode layer 55 may be simultaneously injected using masks with different aperture ratios.

Figure 16A:
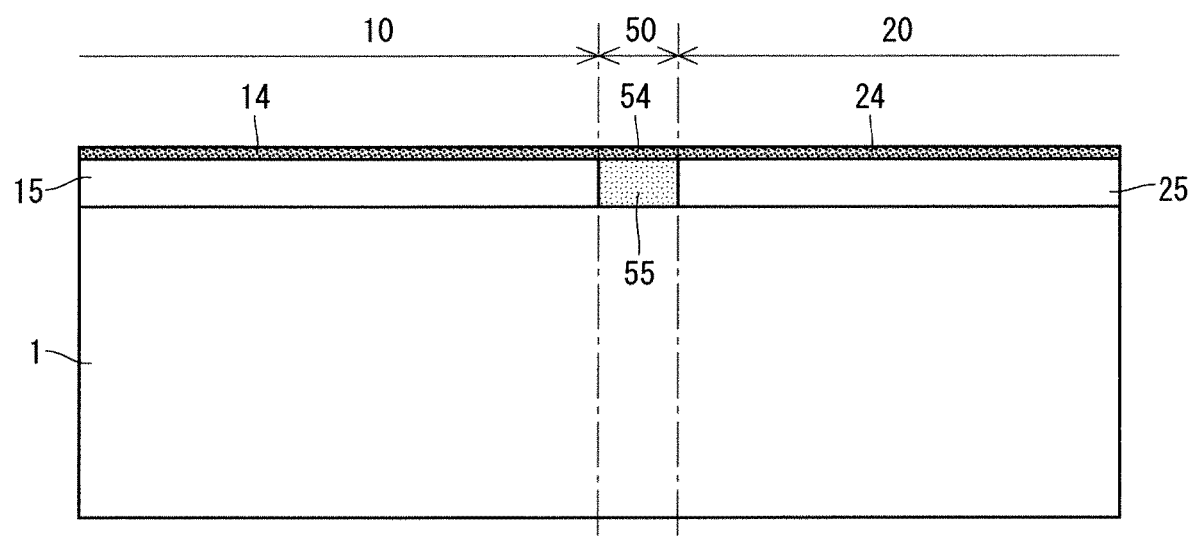

Next, the n⁺-type emitter layer 13 is selectively formed on the first main surface side of the p-type base layer 15 in the IGBT region 10 by the mask processing and injecting n-type impurities. The n-type impurities to be injected may be, for example, arsenic (As) or phosphorus (P). Then, as illustrated in FIG. 16A, mask processing and injection of p-type impurities allow the p⁺-type contact layer 14 to be selectively formed on the first main surface side of the p-type base layer 15 in the IGBT region 10, and the p⁺-type contact layer 24 to be selectively formed on the first main surface side of the p-type anode layer 25 in the diode region 20. Similarly, the p⁺-type contact layer 54 is selectively formed on the first main surface side of the p⁻-type anode layer 55 in the boundary region 50. The p-type impurities to be injected may be, for example, boron or aluminum.

Figure 16B:
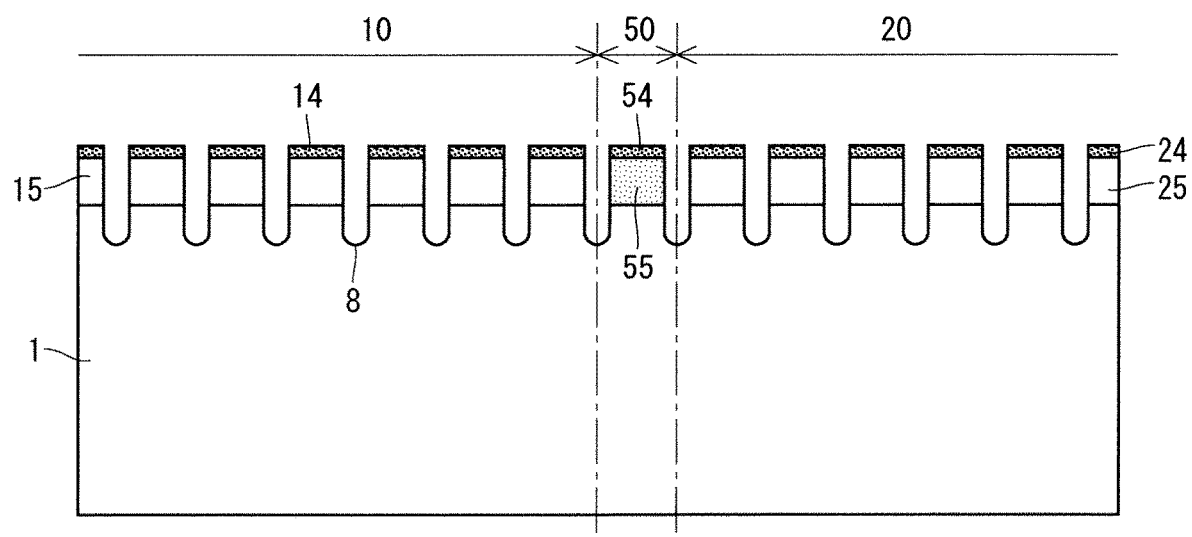

Next, as illustrated in FIG. 16B, a trench 8 is formed passing through the p-type base layer 15, the p-type anode layer 25, or the p⁻-type anode layer 55 from the first main surface side of the semiconductor substrate and reaching the n⁻-type drift layer 1. For example, the trench 8 is formed as follows: after an oxide film such as SiO₂ is deposited on the semiconductor substrate, an opening is formed in a portion of the oxide film, where the trench 8 is to be formed, by the mask processing; and the semiconductor substrate is etched using the oxide film with the opening formed as a mask. Although in FIG. 16B, trenches 8 are formed at a pitch that is identical in the IGBT region 10, the diode region 20, and the boundary region 50, the pitch of the trenches 8 may be different among the IGBT region 10, the diode region 20, and the boundary region 50. The trenches 8 can be appropriately changed in pitch and pattern in plan view by changing a mask pattern used in the mask processing.

Figure 17A:
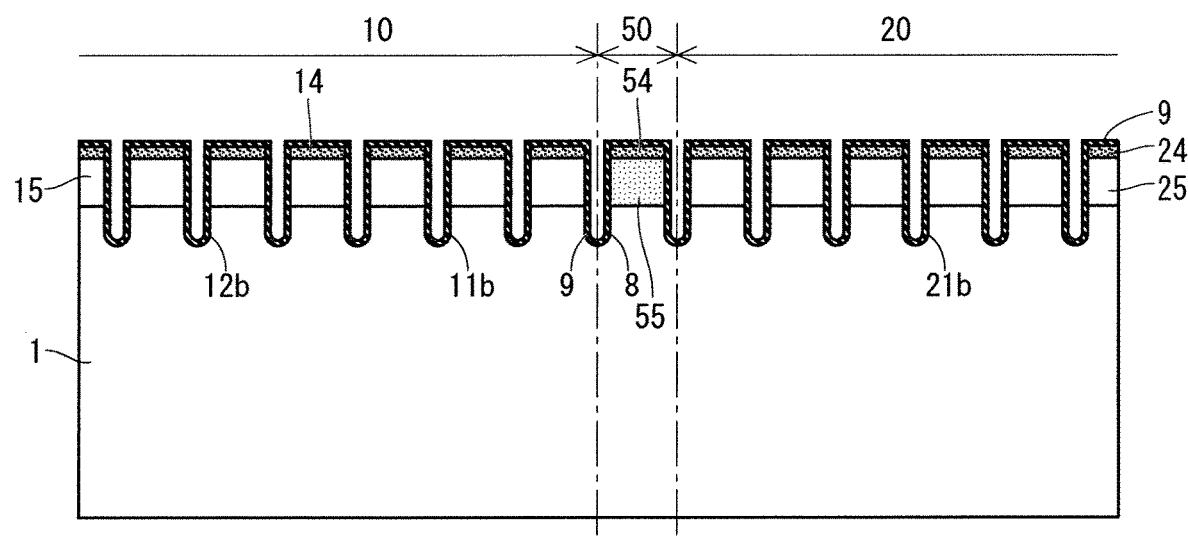

Next, as illustrated in FIG. 17A, the semiconductor substrate is heated in an atmosphere containing oxygen to form an oxide film 9 on an inner wall of the trench 8 and the first main surface of the semiconductor substrate. The oxide film 9 formed in the trench 8 in the IGBT region 10 serves as the corresponding one of the gate trench insulating film 11b of the active trench gate 11 and the dummy trench insulating film 12b of the dummy trench gate 12. The oxide film 9 formed in the trench 8 in the diode region 20 serves as the diode trench insulating film 21b. The oxide film 9 formed on the first main surface of the semiconductor substrate is removed in a later step except for a portion formed in the trench 8.

Figure 17B:
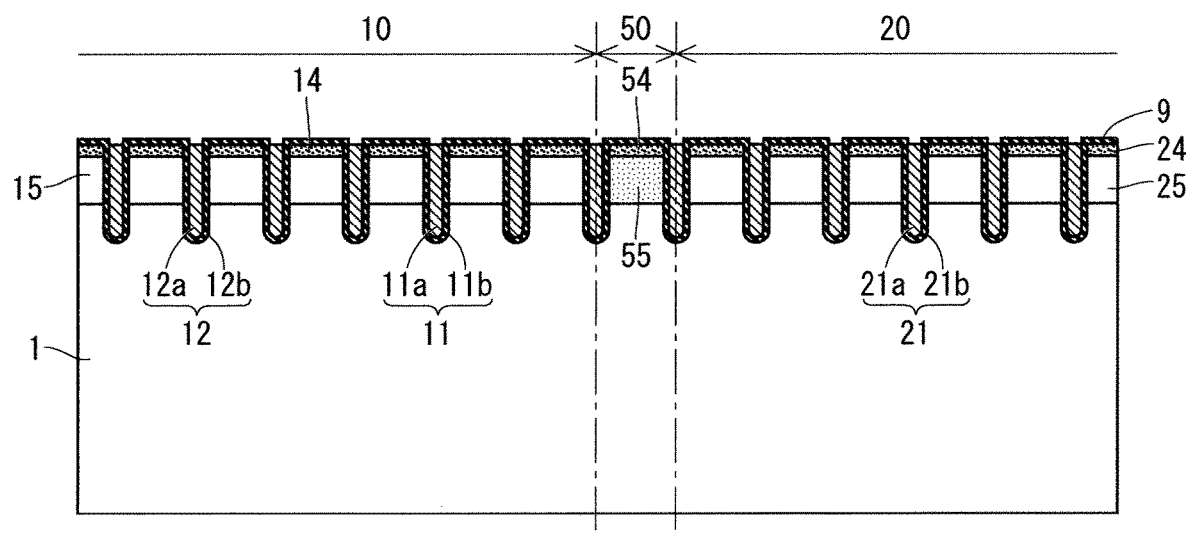

Next, as illustrated in FIG. 17B, polysilicon doped with n-type or p-type impurities is deposited on the oxide film 9 in the trench 8 by chemical vapor deposition (CVD) or the like to form the gate trench electrode 11a, the dummy trench electrode 12a, and the diode trench electrode 21a.

Figure 18A:
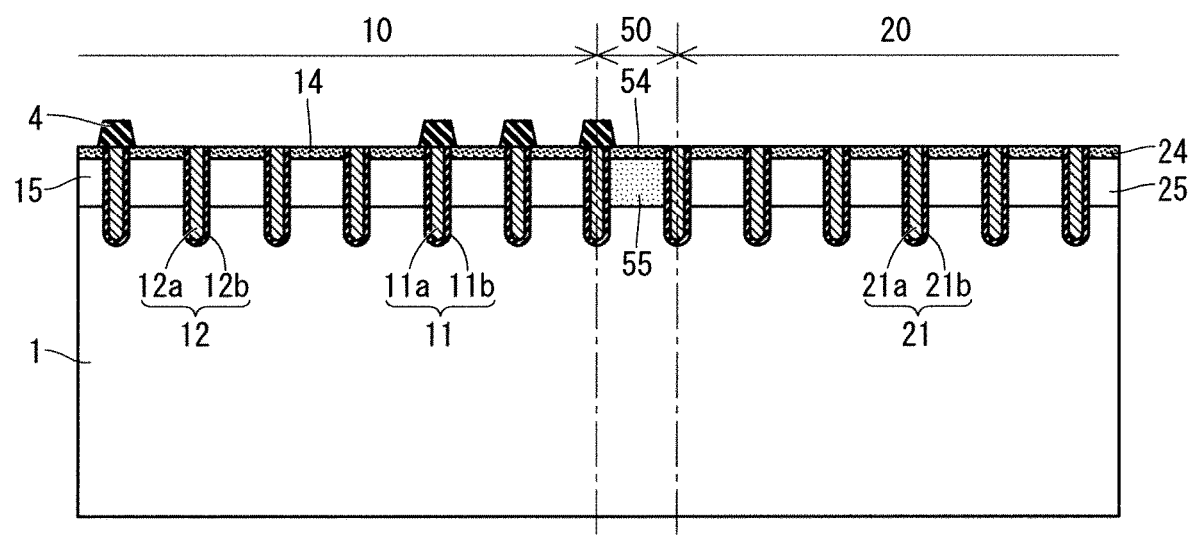

Subsequently, as illustrated in FIG. 18A, the interlayer insulating film 4 is formed on the gate trench electrode 11a of the active trench gate 11 in the IGBT region 10. The interlayer insulating film 4 may be, for example, SiO₂. When the mask processing is performed to form a contact hole in a deposited insulating film that becomes the interlayer insulating film 4, and remove the oxide film 9 formed on the first main surface of the semiconductor substrate, the interlayer insulating film 4 and the like in FIG. 18A are formed. Contact holes of the interlayer insulating film 4 are formed on corresponding portions such as the n+-type emitter layer 13, the p+-type contact layer 14, the p+-type contact layer 24, the dummy trench electrode 12a, and the diode trench electrode 21a.

Figure 18B:
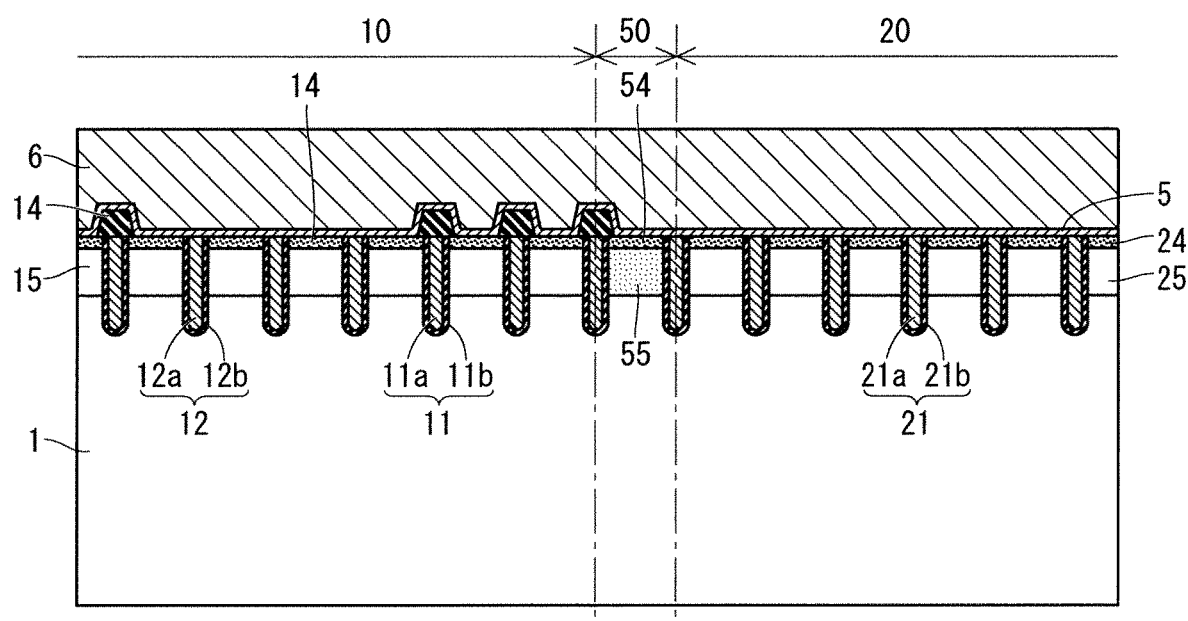

Subsequently, as illustrated in FIG. 18B, the barrier metal 5 is formed on the first main surface of the semiconductor substrate and the interlayer insulating film 4, and the emitter electrode 6 is further formed on the barrier metal 5. The barrier metal 5 is formed by depositing titanium nitride by physical vapor deposition (PVD) or CVD.

The emitter electrode 6 may be formed by depositing an aluminum-silicon alloy (Al—Si alloy) on the barrier metal 5 by, for example, PVD such as sputtering or vapor deposition. Then, a nickel alloy (Ni alloy) may be further formed on the formed aluminum-silicon alloy by electroless plating or electrolytic plating to form the emitter electrode 6. When the emitter electrode 6 is formed by plating, a thick metal film can be easily formed as the emitter electrode 6. This enables increasing heat capacity of the emitter electrode 6 to improve heat resistance thereof. When the emitter electrode 6 made of an aluminum-silicon alloy is formed by PVD and then a nickel alloy is further formed by a plating process, the plating process for forming the nickel alloy may be performed after the second main surface side of the semiconductor substrate is processed.

Figure 19A:
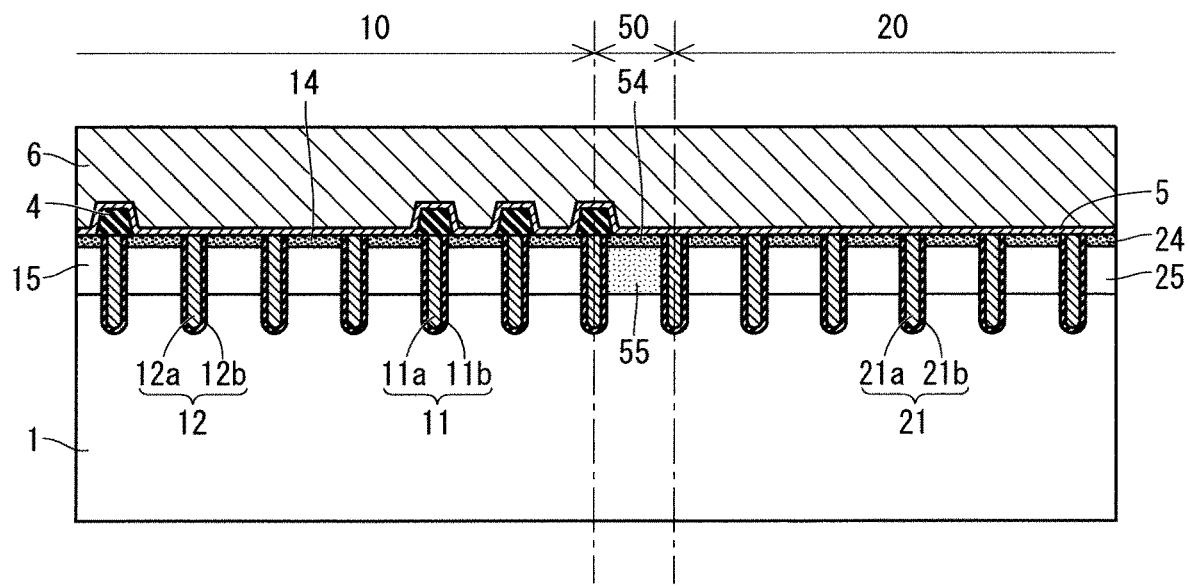

Subsequently, as illustrated in FIG. 19A, the second main surface side of the semiconductor substrate is ground to thin the semiconductor substrate to a designed predetermined thickness. The semiconductor substrate having been ground may have a thickness of 80 μm to 200 μm, for example.

Figure 19B:
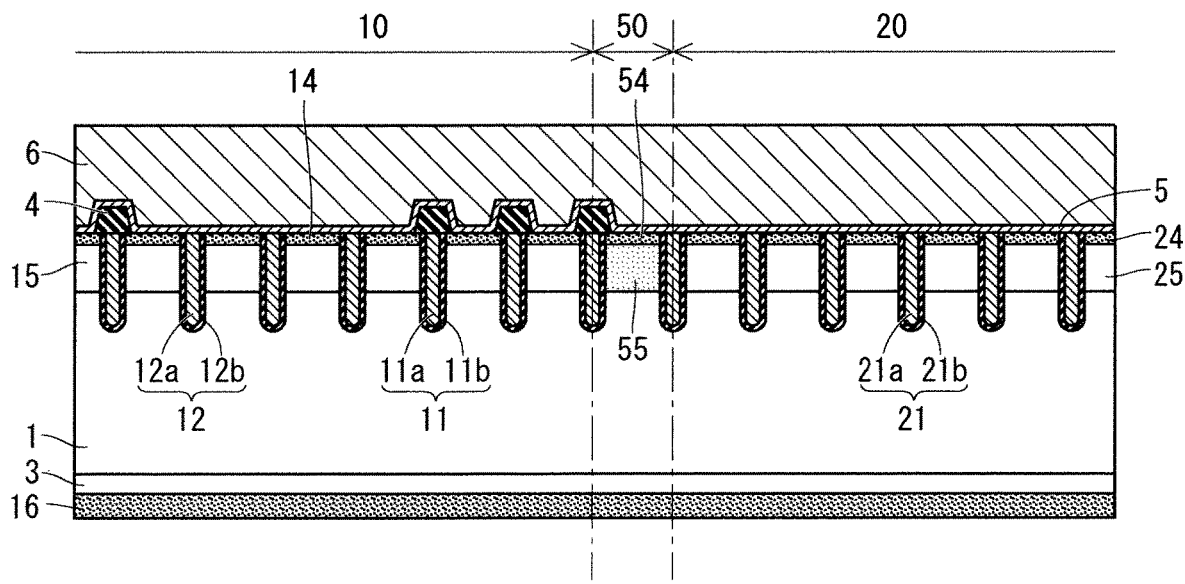

Subsequently, as illustrated in FIG. 19B, n-type impurities are injected from the second main surface side of the semiconductor substrate to form the n-type buffer layer 3. Then, p-type impurities are injected from the second main surface side of the semiconductor substrate to fault the p-type collector layer 16. The n-type buffer layer 3 may be formed in the IGBT region 10, the diode region 20, the terminal region 30, the boundary region 50, and the like, or may be formed only in the IGBT region 10 or the diode region 20. The n-type buffer layer 3 may be formed, for example, by injecting phosphorus (P) ions or protons (H+), or by injecting both protons and phosphorus. Protons can be injected deep from the second main surface of the semiconductor substrate with relatively low acceleration energy. Changing the acceleration energy enables protons to be relatively easily changed in depth of injection. Thus, when protons are injected multiple times to form the n-type buffer layer 3 while the acceleration energy is changed, the n-type buffer layer 3 can be formed thicker in a thickness direction of the semiconductor substrate than that formed from phosphorus.

In contrast, phosphorus can have a higher activation rate as n-type impurities than protons. Thus, when the n-type buffer layer 3 is formed from phosphorus, even a semiconductor substrate reduced in thickness can prevent punch-through of a depletion layer. To further thin the semiconductor substrate, both protons and phosphorus are preferably injected to form the n-type buffer layer 3. In this case, the protons are injected deeper from the second main surface than the phosphorus.

The p-type collector layer 16 may be formed by injecting boron (B), for example. The p-type collector layer 16 is also formed in the boundary region 50, and the p-type collector layer 16 in the boundary region 50 becomes the p-type collector layer 56. The p-type collector layer 16 is also formed in the terminal region 30, and the p-type collector layer 16 in the terminal region 30 becomes the p-type terminal collector layer 16a. After boron ions are injected from the second main surface side of the semiconductor substrate, the second main surface is irradiated with a laser for laser annealing to activate the injected boron and form the p-type collector layer 16. At this time, phosphorus injected into a relatively shallow position from the second main surface of the semiconductor substrate is also activated simultaneously. Then, protons are activated at a relatively low annealing temperature of 380° C. to 420° C., so that temperature of the entire semiconductor substrate needs to be prevented from exceeding 380° C. to 420° C. after the protons are injected, except for the step of activating the protons. The laser annealing can raise temperature only near the second main surface of the semiconductor substrate, and thus can be used to activate n-type impurities or p-type impurities even after protons are injected.

Figure 20A:
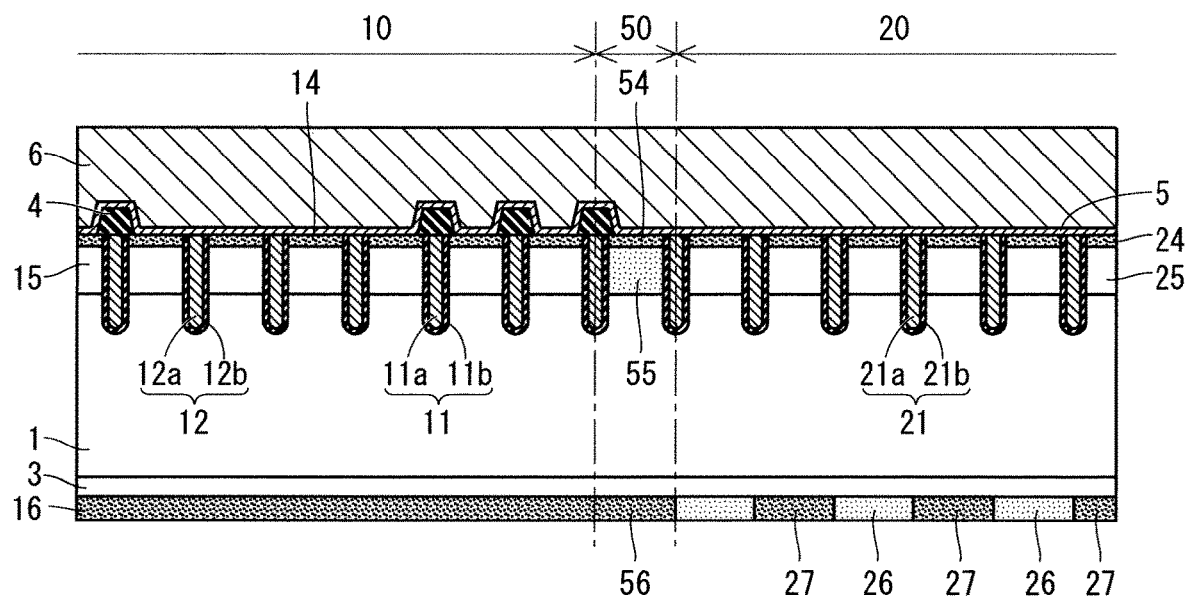

Subsequently, as illustrated in FIG. 20A, the n+-type cathode layer 26 is selectively formed on the second main surface side in the diode region 20. The diode region 20 on the second main surface side includes the p-type collector layer 16 without the n+-type cathode layer 26, which becomes the p+-type carrier discharge layer 27.

The n+-type cathode layer 26 may be formed by injecting phosphorus (P), for example. The n-type impurities for forming the n+-type cathode layer 26 have an injection rate larger than an injection rate of the p-type impurities for forming the p-type collector layer 16. Although FIG. 20A illustrates the p-type collector layer 16 and the n+-type cathode layer 26 that have an equal depth from the second main surface, the n+-type cathode layer 26 may have a depth more than a depth of the p-type collector layer 16. The n+-type cathode layer 26 is formed in a region that needs to be ultimately an n-type by injecting n-type impurities into a region where p-type impurities are injected, so that the n-type impurities have a concentration higher than a concentration of the p-type impurities injected into the entire region where the n+-type cathode layer 26 is formed.

Figure 20B:
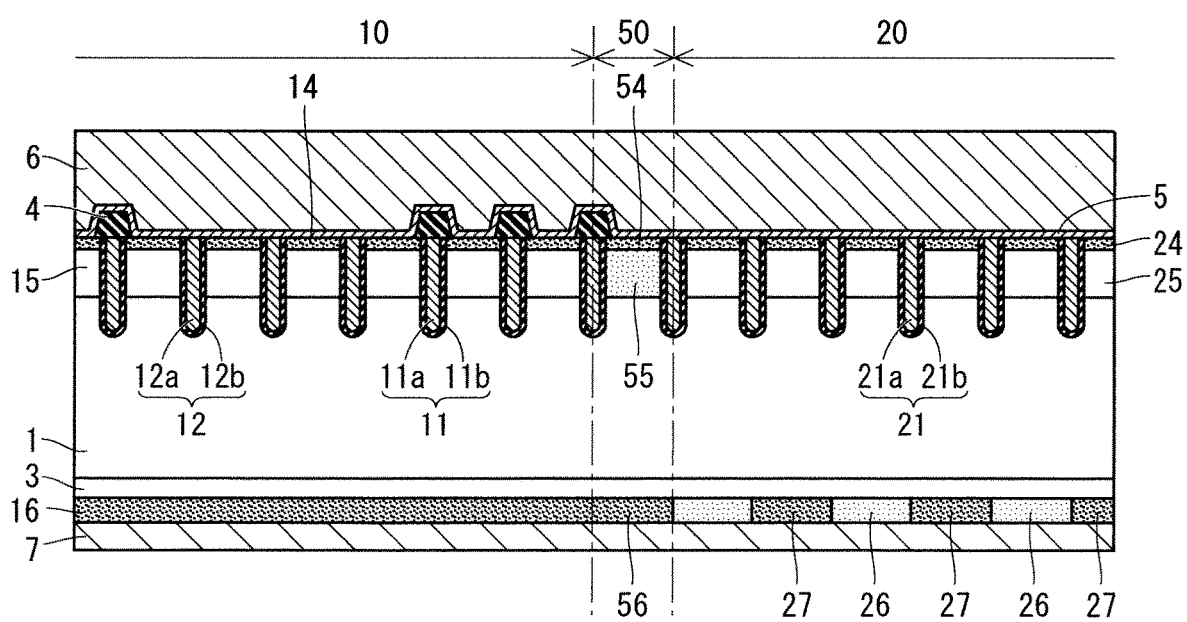

Subsequently, as illustrated in FIG. 20B, the collector electrode 7 is formed on the second main surface of the semiconductor substrate. The collector electrode 7 is formed throughout the entire surface of the second main surface, including the IGBT region 10, the diode region 20, the terminal region 30, the boundary region 50, and the like. The collector electrode 7 may be formed throughout the entire surface of the second main surface of an n-type wafer that is a semiconductor substrate. The collector electrode 7 may be formed by depositing an aluminum silicon alloy (Ai-Si alloy), titanium (Ti), or the like by PVD such as sputtering or vapor deposition, and may be formed by layering multiple metals such as an aluminum silicon alloy, titanium, nickel or gold, and the like. The collector electrode 7 may be formed by further forming a metal film by electroless plating or electrolytic plating on a metal film formed by PVD.

The semiconductor device 100, 101 is manufactured by steps as described above. Multiple semiconductor devices 100, 101 are manufactured while being integrated in a matrix on a semiconductor substrate such as one n-type wafer. Thus, the semiconductor devices 100, 101 are individually separated by laser dicing or blade dicing.

Summary of First Preferred Embodiment

In the first preferred embodiment as described above, the p+-type carrier discharge layer 27 is provided on the second main surface side in the diode region 20. During forward operation of a diode, holes injected from the p-type anode layer 25 on the first main surface side are discharged from the collector electrode 7 on the second main surface side. Although at this time, the n$^+$-type cathode layer 26 serves as a potential barrier for the holes, the p$^+$-type carrier discharge layer 27 has a p-type. This causes the holes to be discharged more efficiently, so that the amount of accumulated holes inside the n$^-$-type drift layer 1 can be reduced. Thus, recovery loss can be reduced during recovery operation.

Here, a structure without the boundary region 50 between the diode region 20 and the IGBT region 10 allows holes to flow into the diode region 20 from the p-type base layer 15 of the IGBT during forward operation of the diode, so that recovery loss during recovery operation is less likely to be effectively reduced. In contrast, the first preferred embodiment includes the boundary region 50 provided between the diode region 20 and the IGBT region 10, and the p$^-$-type anode layer 55 having a lower concentration of p-type impurities than the p-type anode layer 25 in the diode region 20 is provided on its first front face side of the boundary region 50. This causes the number of holes injected into the boundary region 50 to be reduced, and an inflow of holes into the diode region 20 to be also reduced, so that the recovery loss can be effectively reduced.

Second Preferred Embodiment

Figure 21:
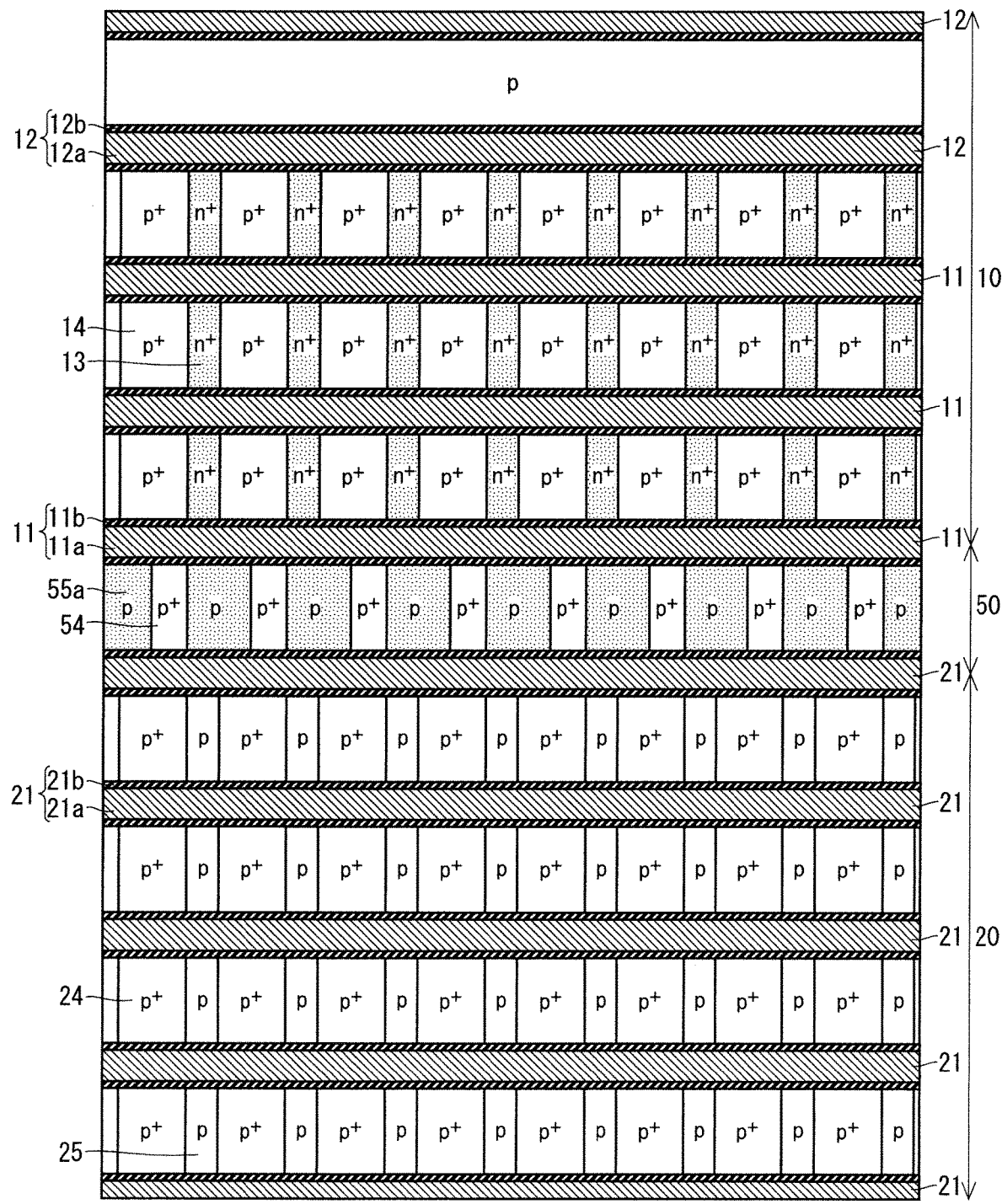
FIG. 21 is a partially enlarged plan view illustrating a structure of a boundary region between an IGBT region and a diode region of a semiconductor device according to a second preferred embodiment.

FIG. 21 is a plan view illustrating a structure of a boundary region 50 between an IGBT region 10 and a diode region 20 of a semiconductor device according to a second preferred embodiment, and is specifically a plan view corresponding to FIG. 9.

Here, in the structure of FIG. 9 of the first preferred embodiment, the p$^+$-type contact layer 54 and the p$^-$-type anode layer 55 in the boundary region 50 are substantially equal in area to the p$^+$-contact layer 24 and the p-type anode layer 25 in the diode region 20. Thus, in the first preferred embodiment, an occupied area ratio of the p$^+$-type contact layer 54 with respect to an area where the emitter electrode 6 is in contact with the semiconductor substrate in the boundary region 50 is substantially equal to an occupied area ratio of the p$^+$-type contact layer 24 with respect to an area where the emitter electrode 6 is in contact with the semiconductor substrate in the diode region 20.

In contrast, in a structure of FIG. 21 of the second preferred embodiment, a p$^+$-type contact layer 54 in the boundary region 50 has an area smaller than a p$^+$-type contact layer 24 in the diode region 20. Then, the boundary region 50 includes, instead of the p$^-$-type anode layer 55, a p-type anode layer 55a having a higher concentration of p-type impurities and a larger area in plan view than the p$^-$-type anode layer 55. The concentration of p-type impurities in the p-type anode layer 55a is, for example, similar to a concentration of p-type impurities in the p-type anode layer 25. As a result, in the present second preferred embodiment, an occupied area ratio of the p$^+$-type contact layer 54 with respect to an area where the emitter electrode 6 is in contact with the semiconductor substrate in the boundary region 50 is smaller than an occupied area ratio of the p$^+$-type contact layer 24 with respect to an area where the emitter electrode 6 is in contact with the semiconductor substrate in the diode region 20. However, the boundary region 50 according to the present second preferred embodiment is not limited to the structure including the p$^+$-type contact layer 54 and the p-type anode layer 55a, and may include the p$^+$-type contact layer 54 and the p$^-$-type anode layer 55 as in the first preferred embodiment. Another structure is similar to that of the first preferred embodiment.

Summary of Second Preferred Embodiment

During forward operation of a diode, the p$^+$-type contact layer 24 on the first main surface side in the diode region 20 serves as a potential barrier for electrons. As the occupied area ratio of the p$^+$-type contact layer 24 with respect to the area where the emitter electrode 6 is in contact with the semiconductor substrate increases, accumulation of electrons increases, and thus recovery loss increases. The second preferred embodiment includes the boundary region 50 provided between the diode region 20 and the IGBT region 10, and the occupied area ratio with respect of the p$^+$-type contact layer 54 to the area where the emitter electrode 6 is in contact with the semiconductor substrate in the boundary region 50 is relatively small. This causes the number of electrons injected into the boundary region 50 to be reduced, and an inflow of electrons into the diode region 20 to be also reduced, so that the recovery loss can be effectively reduced.

Third Preferred Embodiment

Figure 22:
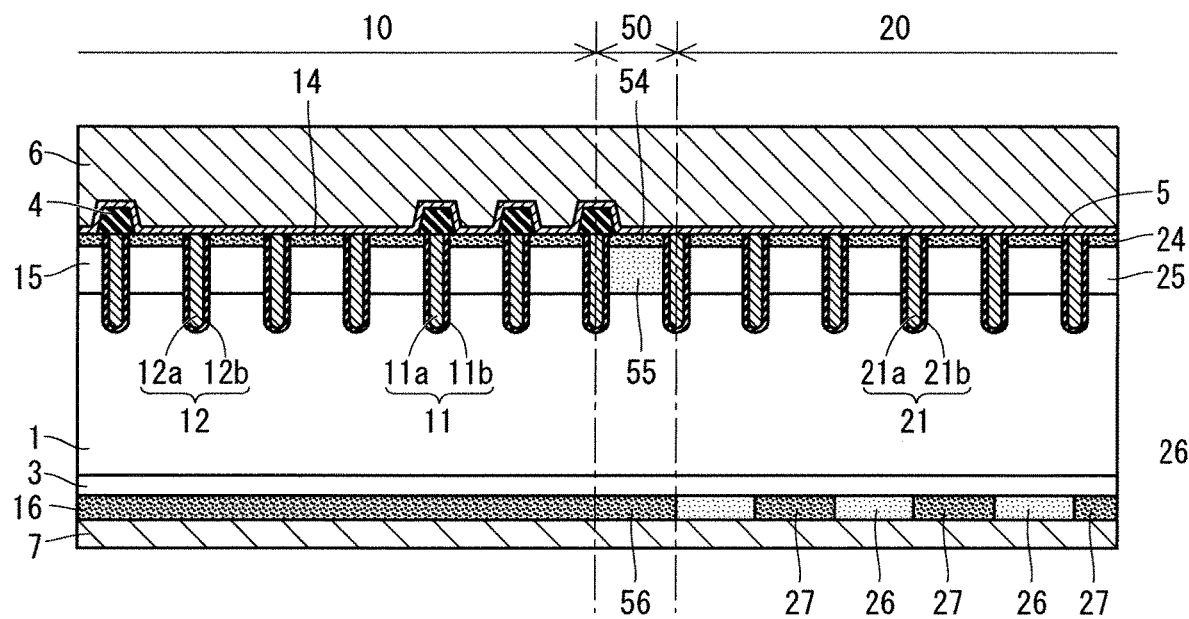
FIG. 22 is a sectional view illustrating a structure of a boundary region between an IGBT region and a diode region of a semiconductor device according to a third preferred embodiment.

FIG. 22 is a sectional view illustrating a structure of a boundary region 50 between an IGBT region 10 and a diode region 20 of a semiconductor device according to a third preferred embodiment, and is specifically a sectional view corresponding to FIG. 10. The present third preferred embodiment includes a p$^+$-type carrier discharge layer 27 having a maximum width of 10 μm or less in the in-plane direction. Another structure is similar to that of the first preferred embodiment or the second preferred embodiment.

As described in the first preferred embodiment, the p$^+$-type carrier discharge layer 27 allows holes to be discharged more efficiently during forward operation of a diode, and thus the amount of holes accumulated in an n$^-$-type drift layer 1 can be reduced. However, electron injection from a collector electrode 7 is performed only from an n$^+$-type cathode layer 26, so that current density becomes somewhat non-uniform within a diode region 20. This causes an impact ionization current due to a local increase in current density to be likely to occur during recovery operation, and thus may cause an increase in recovery loss.

FIG. 23 is a diagram illustrating results of simulating effect of increase in recovery loss due to an impact ionization current during recovery operation. The results of FIG. 23 are acquired by calculating the recovery loss by dividing Wp being a width of the p$^+$-type carrier discharge layer 27 and a repeating pitch in a structure in which the p$^+$-type carrier discharge layer 27 and the n$^+$-type cathode layer 26 are repeated at regular distance intervals on a second main surface of the diode region 20. The repeat pitch ranges from 6 μm to 60 μm, although it is not shown in FIG. 23. The vertical axis represents a ratio (=Err2/Err1) of recovery loss Err1 when impact ionization is not calculated and recovery loss Err2 when the impact ionization is calculated. A larger Err2/Err1 represents a more increase in recovery loss due to the impact ionization current.

Summary of Third Preferred Embodiment

The present third preferred embodiment includes the p$^+$-type carrier discharge layer 27 having a maximum width, i.e., a Wp of 10 μm or less in the in-plane direction. This kind of structure enables the effect of the impact ionization current on the recovery loss to be reduced from the calculation result of FIG. 23, and thus the recovery loss can be effectively reduced.

Fourth Preferred Embodiment

In the present fourth preferred embodiment, a $p^+$-type carrier discharge layer 27 has an area that is 20% or more of the sum of the area of the $p^+$-type carrier discharge layer 27 and an area of an $n^+$-type cathode layer 26 in plan view. Another structure is similar to that of each of the first to third preferred embodiments.

FIG. 24 shows results of a relationship between an area ratio of the $p^+$-type carrier discharge layer 27 with respect to the sum of the area of the $p^+$-type carrier discharge layer 27 and the area of the $n^+$-type cathode layer 26, and recovery loss, the results being calculated by simulation in the fourth preferred embodiment. As the area ratio of the $p^+$-type carrier discharge layer 27 increases, the recovery loss decreases. When the area ratio of the $p^+$-type carrier discharge layer 27 is 20% or more, reduction of the recovery loss is saturated, and thus almost the same loss reduction effect can be obtained.

Summary of Fourth Preferred Embodiment

In the present fourth preferred embodiment, the $p^+$-type carrier discharge layer 27 has an area that is 20% or more of the sum of an area of the $p^+$-type carrier discharge layer 27 and an area of an $n^+$-type cathode layer 26, so that the recovery loss can be effectively reduced.

Fifth Preferred Embodiment

Figure 25A:
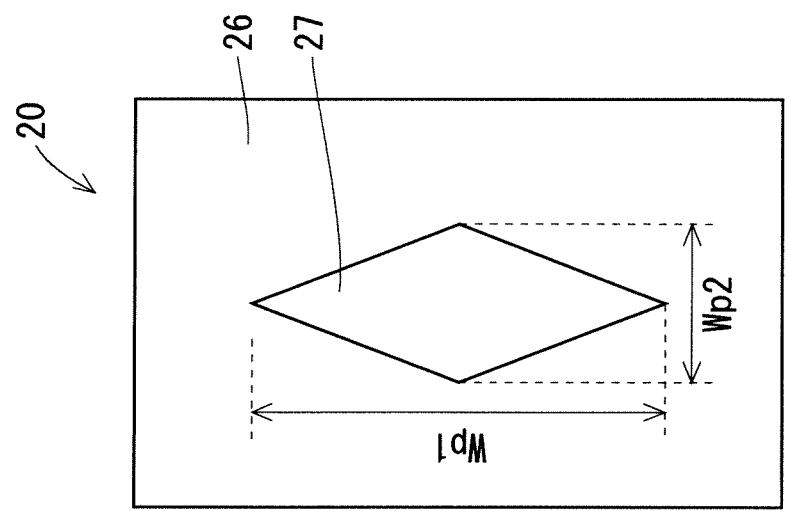
FIGS. 25A to 25C are each a partially enlarged plan view illustrating a structure in a diode region of a semiconductor device according to a fifth preferred embodiment.
Figure 25B:
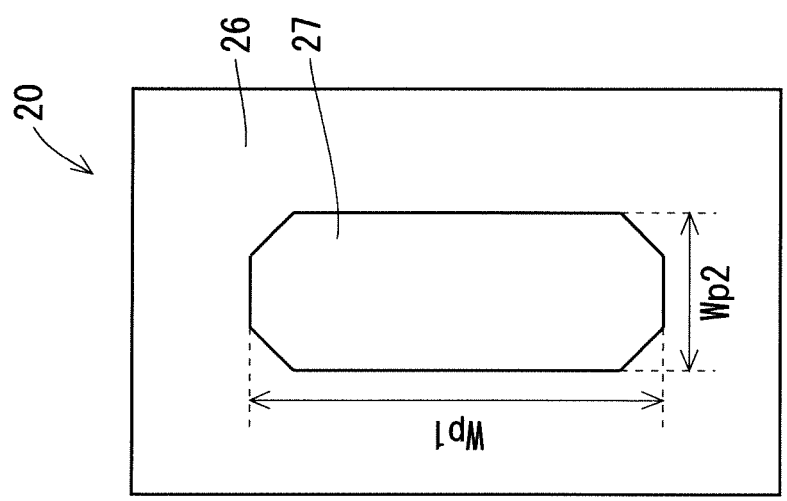
Figure 25C:
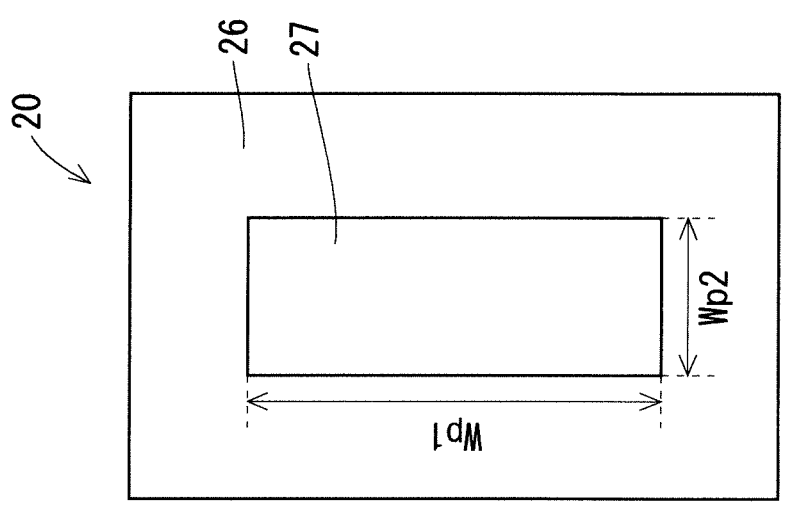

FIGS. 25A to 25C are each an enlarged plan view of a diode region 20 of a semiconductor device according to a fifth embodiment. The present fifth preferred embodiment includes a $p^+$-type carrier discharge layer 27 having a long side Wp1 and a short side Wp2 with a length of ½ or less of a length of the long side Wp1 in plan view. Another structure is similar to that of each of the first to fourth preferred embodiments.

Summary of Fifth Preferred Embodiment

The present fifth preferred embodiment includes the $p^+$-type carrier discharge layer 27 having the short side Wp2 that is relatively short in length, so that an area ratio of the $p^+$-type carrier discharge layer 27 can be relatively increased by relatively lengthening the long side Wp1 of the $p^+$-type carrier discharge layer 27. This enables reducing not only dynamic avalanche during recovery operation but also carrier density during forward operation, so that the recovery loss can be effectively reduced.

Sixth Preferred Embodiment

Figure 26:
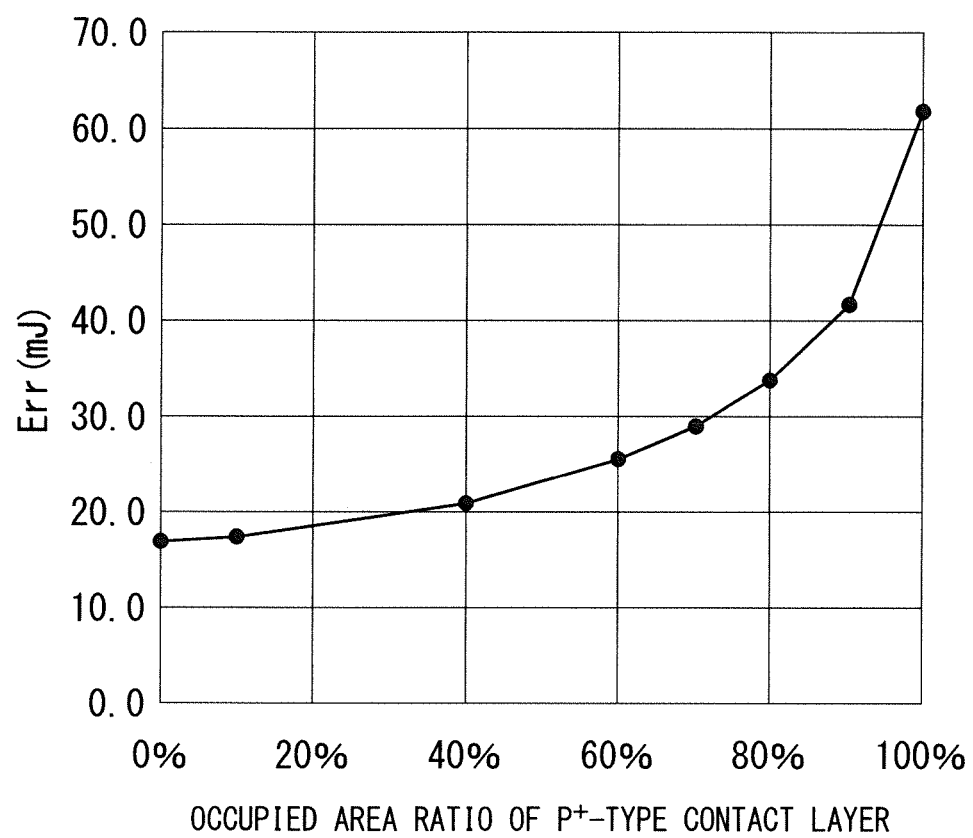
FIG. 26 is a diagram illustrating a simulation result of a semiconductor device according to a sixth preferred embodiment.

In the present sixth preferred embodiment, an occupied area ratio of a $p^+$-type contact layer 24 with respect to an area where an emitter electrode 6 is in contact with a semiconductor substrate in a diode region 20 is 0.8 or less. Another structure is similar to that of each of the first to fifth preferred embodiments. FIG. 26 shows results of a relationship between the occupied area ratio of the $p^+$-type contact layer 24 with respect to an area where the emitter electrode 6 is in contact with the semiconductor substrate in the diode region 20, and recovery loss (Err), the results being calculated by simulation in the sixth preferred embodiment. The results show that as the occupied area ratio of the $p^+$-type contact layer 24 increases, the recovery loss increases, and the occupied area ratio of the $p^+$-type contact layer 24 exceeding 0.8 (80%) causes the recovery loss to increase sharply.

Summary of Sixth Preferred Embodiment

As described above, during forward operation of a diode, the $p^+$-type contact layer 24 on a first main surface side in the diode region 20 serves as a potential barrier for electrons. Thus, an area of the $p^+$-type contact layer 24 increases with respect to the area where the emitter electrode 6 is in contact with the semiconductor substrate, accumulation of electrons increases, and thus the recovery loss increases. In the present sixth preferred embodiment, an area ratio of the $p^+$-type contact layer 24 in the diode region 20 is 0.8 or less, so that carrier accumulation in the diode region 20 can be reduced, and thus the recovery loss can be effectively reduced.

Seventh Preferred Embodiment

Figure 27:
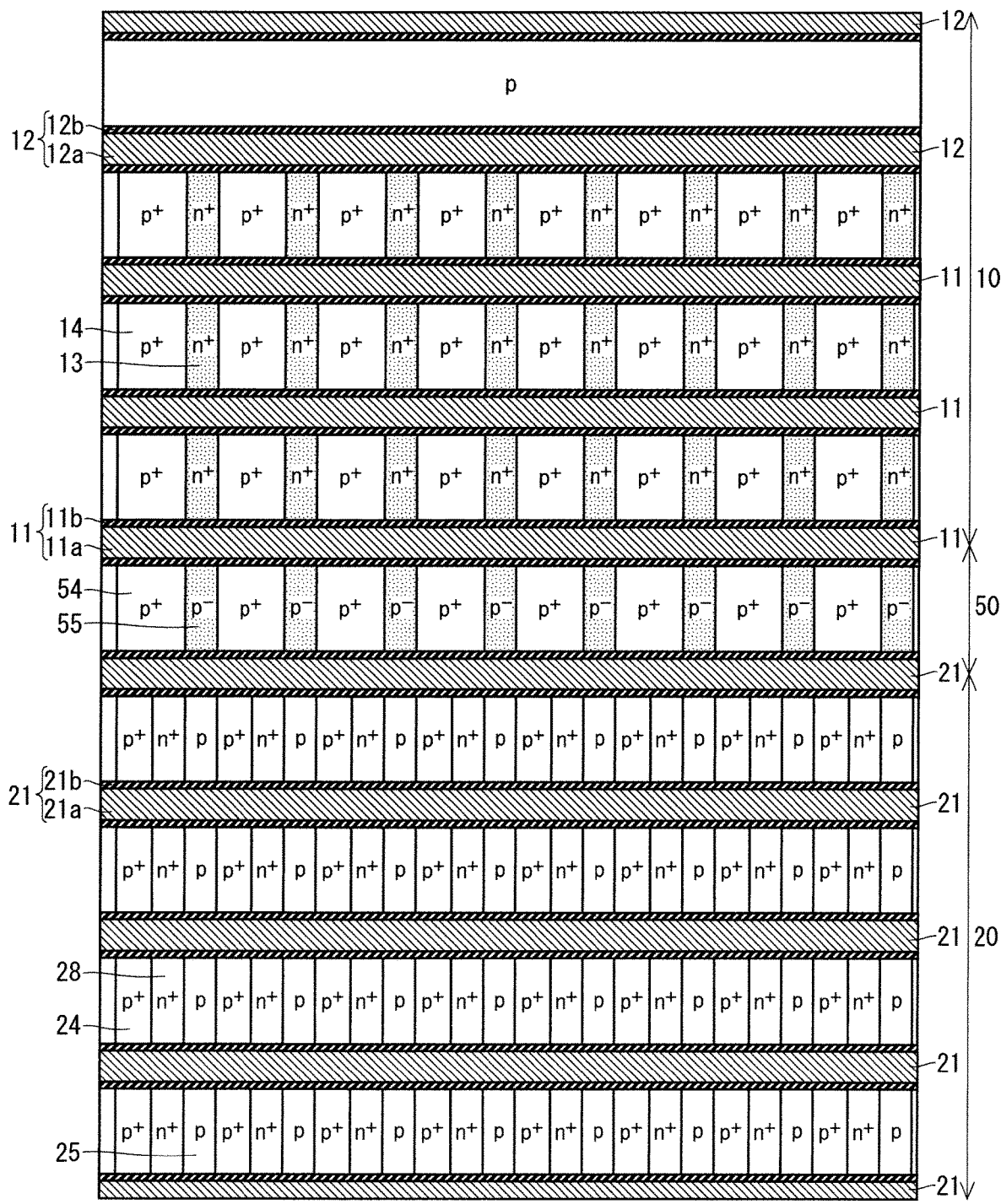
FIG. 27 is a partially enlarged plan view illustrating a structure of a boundary region between an IGBT region and a diode region of a semiconductor device according to a seventh preferred embodiment.

FIG. 27 is a plan view illustrating a structure of a boundary region 50 between an IGBT region 10 and a diode region 20 of a semiconductor device according to a seventh preferred embodiment, and is specifically a plan view corresponding to FIG. 9. The semiconductor substrate according to the present seventh preferred embodiment further includes an $n^+$-type carrier discharge layer 28 that is a second carrier discharge layer. The $n^+$-type carrier discharge layer 28 is provided on a first main surface side in the diode region 20, being adjacent to at least one of a p-type anode layer 25 and a $p^+$-type contact layer 24 in an in-plane direction. FIG. 27 illustrates an example in which the $n^+$-type carrier discharge layer 28 is surrounded by the p-type anode layer 25 and the $p^+$-type contact layer 24.

Summary of Seventh Preferred Embodiment

During forward operation of a diode, the $n^+$-type carrier discharge layer 28 on the first main surface side of the semiconductor substrate does not serve as a potential barrier for electrons, so that electrons injected from an $n^+$-type cathode layer 26 on a second main surface side are efficiently discharged through the $n^+$-type carrier discharge layer 28. This causes accumulation of electrons in the diode region 20 to be reduced during the forward operation, so that recovery loss can be effectively reduced.

Each of the preferred embodiments and modifications may be freely combined, or each of the preferred embodiments and modifications may be appropriately modified or eliminated.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate of a first conductive type, having a first main surface and a second main surface opposite to the first main surface, an IGBT region, a diode region, and a boundary region between the IGBT region and the diode region, being provided along an in-plane direction in the semiconductor substrate;
   an emitter electrode provided on the first main surface of the semiconductor substrate; and a collector electrode provided on the second main surface of the semiconductor substrate, the semiconductor substrate including:
- a first anode layer of a second conductive type and a first contact layer of the second conductive type with a higher concentration of impurities of the second conductive type than the first anode layer, each of the first anode layer and the first contact layer being provided on a first main surface side being a side of the first main surface, in the diode region, the first main surface side being a side of the first main surface;
- a cathode layer of the first conductive type provided on a second main surface side being a side of the second main surface, in the diode region;
- a first carrier discharge layer of the second conductive type provided adjacent to the cathode layer in the in-plane direction on the second main surface side in the diode region;
- a second anode layer of the second conductive type and a second contact layer of the second conductive type with a higher concentration of impurities of the second conductive type than the second anode layer, each of the second anode layer and the second contact layer being provided on the first main surface side in the boundary region; and
- a collector layer of the second conductive type provided on the second main surface side in the boundary region, wherein a concentration of impurities of the second conductive type of the second anode layer is lower than a concentration of impurities of the second conductive type of the first anode layer.

2. The semiconductor device according to claim 1, wherein
the first carrier discharge layer has a maximum width of 10 μm or less.

3. The semiconductor device according to claim 1, wherein
the first carrier discharge layer has an area that is 20% or more of a sum of the area of the first carrier discharge layer and an area of the cathode layer in plan view.

4. The semiconductor device according to claim 1, wherein
the first carrier discharge layer has a long side and a short side with a length of ½ or less of a length of the long side in plan view.

5. The semiconductor device according to claim 1, wherein
an occupied area ratio of the first contact layer with respect to an area where the emitter electrode is in contact with the semiconductor substrate in the diode region is 0.8 or less.

6. The semiconductor device according to claim 1, wherein
the semiconductor substrate further includes a second carrier discharge layer of the first conductive type that is provided on the first main surface side in the diode region, being adjacent to at least one of the first anode layer and the first contact layer in the in-plane direction.

* * * * *